(12) United States Patent
Miura et al.

(10) Patent No.: US 9,601,318 B2
(45) Date of Patent: Mar. 21, 2017

(54) PLASMA PROCESSING METHOD AND PLASMA PROCESSING APPARATUS

(71) Applicant: Tokyo Electron Limited, Tokyo (JP)

(72) Inventors: Shigehiro Miura, Iwate (JP); Hitoshi Kato, Iwate (JP); Jun Sato, Iwate (JP); Toshiyuki Nakatsubo, Iwate (JP); Hiroyuki Kikuchi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/709,656

(22) Filed: May 12, 2015

(65) Prior Publication Data
US 2015/0332895 A1    Nov. 19, 2015

(30) Foreign Application Priority Data
May 15, 2014   (JP) .................................. 2014-101683

(51) Int. Cl.
*H01J 37/32*   (2006.01)
*C23C 16/455*   (2006.01)
(Continued)

(52) U.S. Cl.
CPC .. *H01J 37/32449* (2013.01); *C23C 16/45534* (2013.01); *C23C 16/45536* (2013.01); *C23C 16/45551* (2013.01); *C23C 16/507* (2013.01); *H01J 37/3244* (2013.01); *H01J 37/32715* (2013.01); *H01J 37/32779* (2013.01); *H01J 37/32834* (2013.01); *H01L 21/0228* (2013.01); *H01L 21/31116* (2013.01);
(Continued)

(58) Field of Classification Search
CPC ............. H01J 37/32449; H01J 37/3244; H01J 37/32779; H01J 37/32715; H01J 37/32834; C23C 16/45534; C23C 16/45551; C23C 16/507; C23C 16/45536; H01L 21/67069; H01L 21/0228; H01L 21/31116; H01L 21/68764; H01L 21/3065
See application file for complete search history.

(56) References Cited

U.S. PATENT DOCUMENTS 6,676,760 B2 * 1/2004 Kholodenko ..... C23C 16/45519
                                                118/715
6,837,967 B1 * 1/2005 Berman .............. H01J 37/3244
                                                118/728
(Continued)

FOREIGN PATENT DOCUMENTS

JP        2013-161874       8/2013

*Primary Examiner* — Anita Alanko
(74) *Attorney, Agent, or Firm* — IPUSA, PLLC

(57) ABSTRACT

A plasma processing method is provided. In the method, a distribution of an amount of processing within a surface of a substrate by a plasma process performed on a film deposited on the substrate is obtained. Next, a flow speed of the plasma processing gas is adjusted by increasing the flow speed of the plasma processing gas supplied to a first area where the amount of processing is expected to be increased or by decreasing the flow speed of the plasma processing gas supplied to a second area where the amount of processing is expected to be decreased. Then, the plasma process is performed on the film deposited on the substrate by supplying the plasma processing gas having the adjusted flow speed into the predetermined plasma process area.

11 Claims, 14 Drawing Sheets

(51) Int. Cl.
  *C23C 16/507* (2006.01)
  *H01L 21/687* (2006.01)
  *H01L 21/02* (2006.01)
  *H01L 21/311* (2006.01)
  *H01L 21/67* (2006.01)
  *H01L 21/3065* (2006.01)

(52) U.S. Cl.
  CPC .. *H01L 21/67069* (2013.01); *H01L 21/68764* (2013.01); *H01L 21/3065* (2013.01)

(56) References Cited

U.S. PATENT DOCUMENTS

| | | | |
|---|---|---|---|
| 6,936,547 B2 * | 8/2005 | Li | C23C 16/455 438/680 |
| 2004/0082171 A1 * | 4/2004 | Shin | C23C 16/452 438/689 |
| 2006/0191637 A1 * | 8/2006 | Zajac | B81C 1/00547 156/345.34 |
| 2008/0286982 A1 * | 11/2008 | Li | H01J 37/32412 438/782 |
| 2009/0114156 A1 * | 5/2009 | Nodera | C23C 16/345 118/725 |
| 2009/0194235 A1 * | 8/2009 | Kobayashi | H01J 37/32082 156/345.28 |
| 2013/0042811 A1 * | 2/2013 | Shanker | C23C 16/04 118/723 R |
| 2013/0264308 A1 * | 10/2013 | Yang | H01J 37/32082 216/67 |
| 2014/0367359 A1 * | 12/2014 | Nakano | H01J 37/32449 216/67 |

* cited by examiner

PLASMA PROCESSING METHOD AND PLASMA PROCESSING APPARATUS

CROSS-REFERENCE TO RELATED APPLICATION

The present application is based upon and claims the benefit of priority of Japanese Patent Application No. 2014-101683, filed on May 15, 2014, the entire contents of which are incorporated herein by reference.

BACKGROUND OF THE INVENTION

1. Field of the Invention

The present invention relates to a plasma processing method and a plasma processing apparatus.

2. Description of the Related Art

In a semiconductor device production process, a variety of film deposition processes is performed on a semiconductor wafer (which is hereafter referred to as a "wafer") by a deposition method such as atomic layer deposition (ALD).

Research and development of a turntable-type film deposition apparatus for performing ALD have been conducted in these years. The turntable-type film deposition apparatus includes a rotatable turntable disposed in a vacuum chamber. The turntable has concave portions where wafers are placed. Each of the concave portions has a diameter that is slightly greater than a diameter of each of the wafers. Above the turntable, a supply area to which a reaction gas A is supplied, a supply area to which a reaction gas B is supplied, and a separation area for separating the supply areas are defined.

Also, Japanese Laid-Open Patent Application Publication No. 2013-161874, for example, discloses a turntable-type film deposition apparatus including a plasma generator. The disclosed turntable-type film deposition apparatus uses plasma generated by the plasma generator to deposit various films (functional films) on a substrate, modify a film including carbon deposited on a substrate, and etch a film deposited on a substrate.

In addition, in an etching apparatus other than ALD, a CVD (Chemical Vapor Deposition) apparatus and the like, the plasma process is utilized for etching, film deposition, film modification and the like.

However, in the conventional plasma process, there was no direct and effective parameter for controlling a distribution of an amount of plasma processing within a wafer. Accordingly, the method of adjusting the plasma process had to rely on only an indirect method of adjusting parameters in such a way as to change gas species, a flow rate of the gas, or a pressure and the like that do not necessarily indicate a high correlation with the distribution of the amount of plasma processing and then observing the results.

SUMMARY OF THE INVENTION

Embodiments of the present invention provide a plasma processing method and a plasma processing apparatus solving one or more of the problems discussed above.

More specifically, the embodiments of the present invention may provide a plasma processing method and a plasma processing apparatus capable of properly adjusting an amount of plasma processing within a surface to be processed such as a film surface.

According to an embodiment of the present invention, there is provided a plasma processing method for performing a plasma process on a film deposited on a substrate by supplying a plasma processing gas into a predetermined plasma process area and converting the supplied plasma processing gas to plasma in a plasma generation area formed in the predetermined plasma process area. In the method, a distribution of an amount of processing within a surface of a substrate by a plasma process performed on a film deposited on the substrate is obtained. Next, a flow speed of the plasma processing gas is adjusted by increasing the flow speed of the plasma processing gas supplied to a first area where the amount of processing is expected to be increased so as to make the flow speed in the first area higher than the flow speed in another area or by decreasing the flow speed of the plasma processing gas supplied to a second area where the amount of processing is expected to be decreased so as to make the flow speed in the second area lower than the flow speed in another area. Then, the plasma process is performed on the film deposited on the substrate by supplying the plasma processing gas having the adjusted flow speed into the predetermined plasma process area.

According to another embodiment of the present invention, there is provided a plasma processing apparatus. The plasma processing apparatus includes a process chamber for accommodating at least one substrate therein and performing a plasma process on the substrate, and a turntable for receiving the at least one substrate along a rotational direction thereof and provided in the process chamber. The plasma processing apparatus also includes a plasma process area provided at a predetermined area along the rotational direction of the turntable and defined by a ceiling surface and a side surface above the turntable. The plasma processing apparatus further includes a plurality of gas nozzles for supplying a plasma processing gas to different areas within the plasma process area, and a plasma generator configured to convert the plasma processing gas to plasma.

According to another embodiment of the present invention, there is provided a plasma processing apparatus including a process chamber for accommodating at least one substrate therein and performing a plasma process on the substrate, and a turntable for receiving the at least one substrate along a rotational direction thereof and provided in the process chamber. The plasma processing apparatus also includes a plasma process area provided at a predetermined area along the rotational direction of the turntable and defined by a ceiling surface and a side surface above the turntable, and a gas nozzle for supplying a plasma processing gas into the plasma process area. The plasma processing apparatus further includes a plasma generator provided above the plasma process area and configured to convert the plasma processing gas to plasma in the vicinity of the ceiling surface of the plasma process area, and an exhaust opening for evacuating the process chamber and provided below the turntable. Here, the ceiling surface is set to have a height to cause the plasma processing gas supplied from the gas nozzle to flow along the ceiling surface at a substantially uniform flow speed by resisting a suction force from the exhaust opening.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF THE PREFERRED EMBODIMENTS

Embodiments of the present invention are described below with reference to the accompanying drawings.

[Configuration of Plasma Processing Apparatus]

Figure 1:
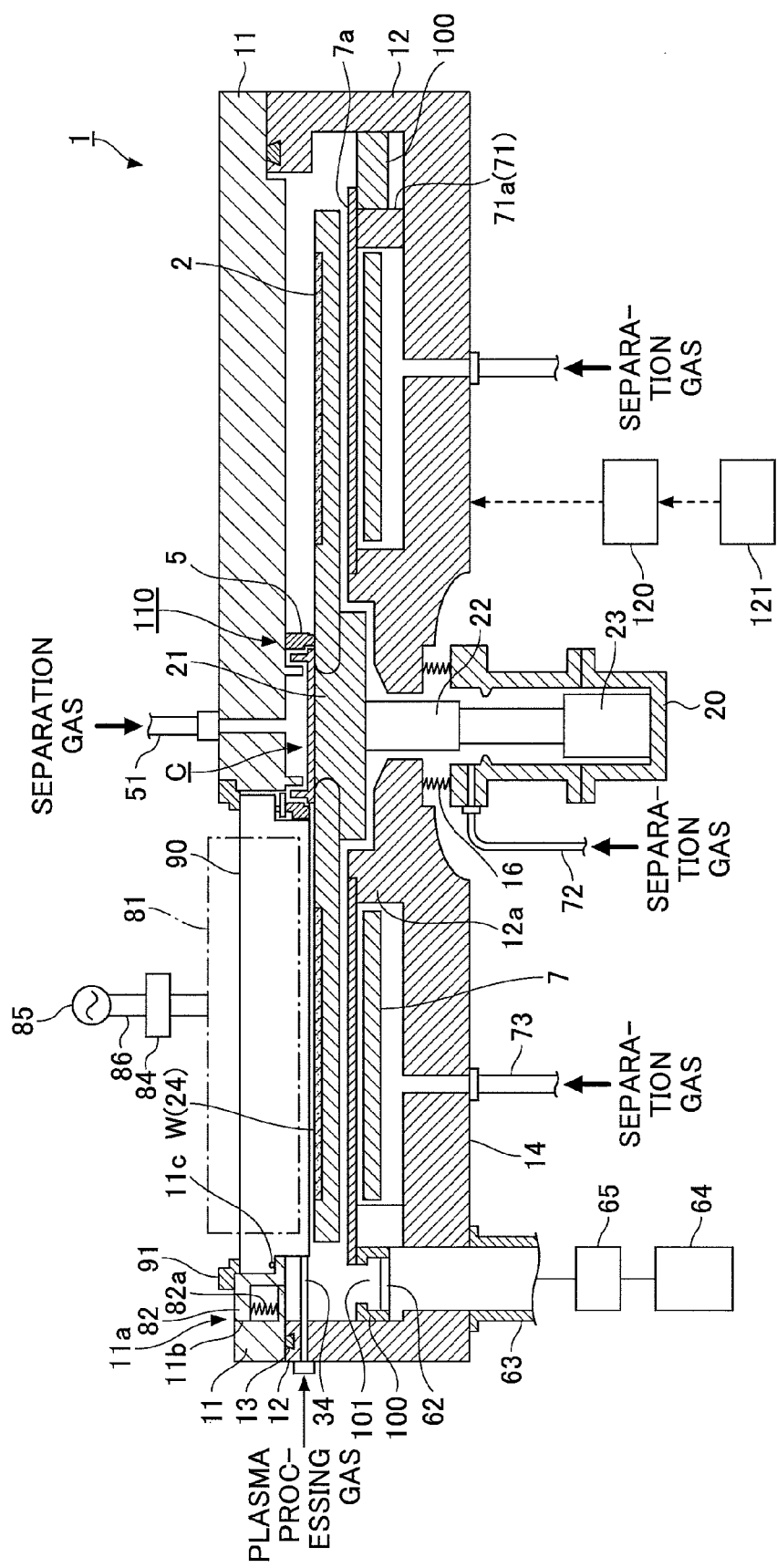
FIG. 1 is a schematic vertical cross-sectional view illustrating a plasma processing apparatus of an example according to an embodiment of the present invention.
Figure 2:
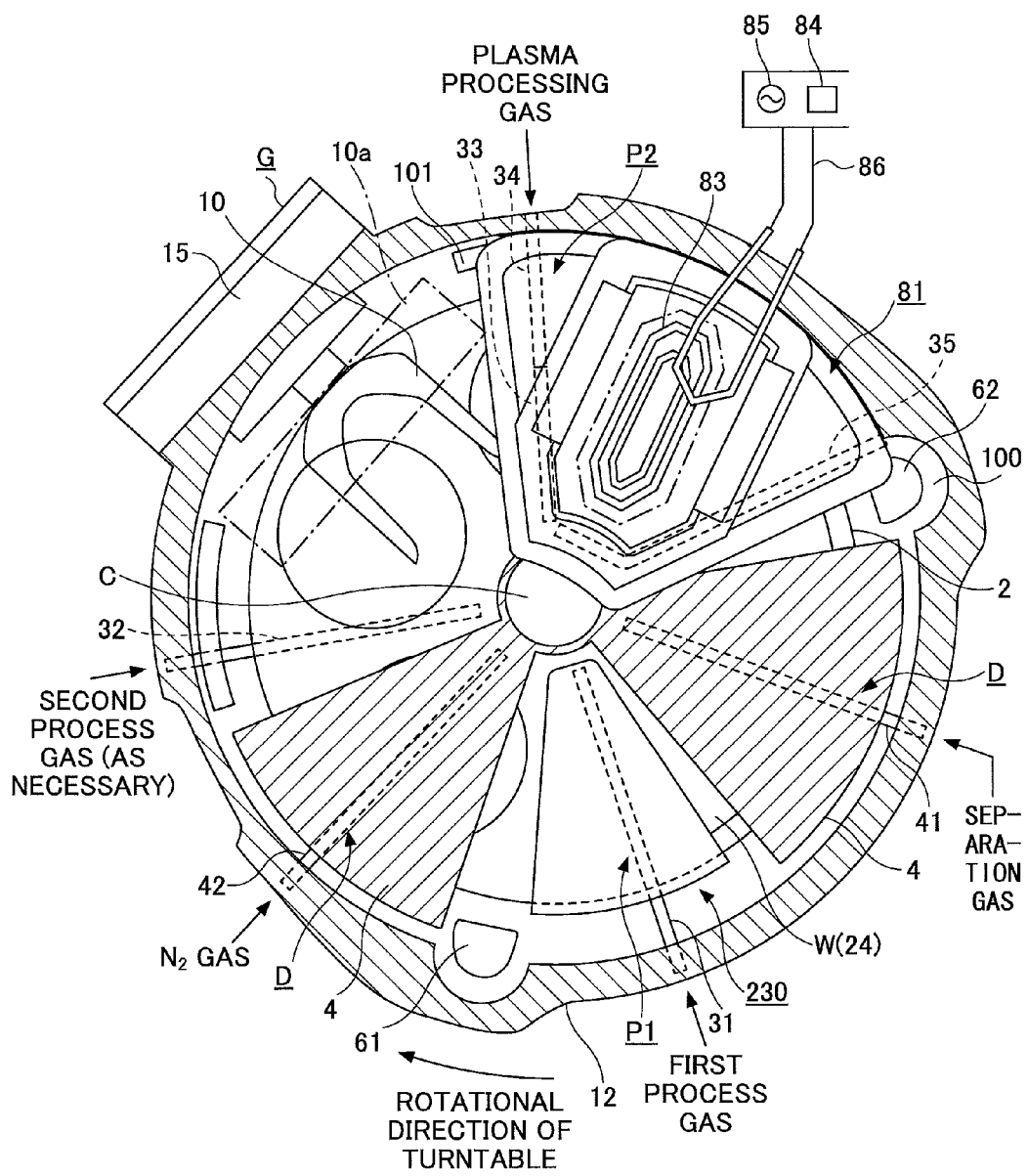
FIG. 2 is a schematic plan view illustrating a plasma processing apparatus of an example according to an embodiment of the present invention.

FIG. 1 is a schematic vertical cross-sectional view illustrating an example of a plasma processing apparatus according to an embodiment of the present invention. FIG. 2 is a schematic plan view illustrating an example of the plasma processing apparatus according to the embodiment. In FIG. 2, for convenience of explanation, a depiction of a top plate 11 is omitted.

As illustrated by FIG. 1, the substrate processing apparatus of the embodiment includes a vacuum chamber 1 having a substantially circular planar shape, and a turntable 2 that is disposed in the vacuum chamber 1 such that the rotational center of the turntable 2 coincides with the center of the vacuum chamber 1. The turntable 2 rotates wafers W placed thereon by rotating around its rotational center.

The vacuum chamber 1 is a process chamber to accommodate wafers W therein and to perform a plasma process on a film or the like deposited on surfaces of the wafers W. The vacuum chamber 1 includes a top plate (ceiling) 11 that faces concave portions 24 formed in a surface of the turntable 2, and a chamber body 12. A ring-shaped seal member 13 is provided at the periphery of the upper surface of the chamber body 12. The top plate 11 is configured to be attachable to and detachable from the chamber body 12. The diameter (inside diameter) of the vacuum chamber 1 in plan view is, for example, but is not limited to, about 1100 mm.

A separation gas supply pipe 51 is connected to the center of the upper side of the vacuum chamber 1 (or the center of the top plate 11). The separation gas supply pipe 51 supplies a separation gas to a central area C in the vacuum chamber 1 to prevent different process gases from mixing with each other in the central area C.

A central part of the turntable 2 is fixed to an approximately-cylindrical core portion 21. A rotational shaft 22 is connected to a lower surface of the core portion 21 and extends in the vertical direction. The turntable 2 is configured to be rotatable by a drive unit 23 about the vertical axis of the rotational shaft 22, in a clockwise fashion in the example of FIG. 2. The diameter of the turntable 2 is, for example, but is not limited to, about 1000 mm.

The rotational shaft 22 and the drive unit 23 are housed in a case body 20. An upper-side flange of the case body 20 is hermetically attached to the lower surface of a bottom part 14 of the vacuum chamber 1. A purge gas supply pipe 72 is connected to the case body 20. The purge gas supply pipe 72 supplies a purge gas (separation gas) such as nitrogen gas to an area below the turntable 2.

A part of the bottom part 14 of the vacuum chamber 1 surrounding the core portion 21 forms a ring-shaped protrusion 12a that protrudes so as to approach the turntable 2 from below.

Circular concave portions 24 (or substrate receiving areas), where the wafers W having a diameter of, for example, 300 mm are placed, are formed in the upper surface of the turntable 2. A plurality of (e.g., five) concave portions 24 are provided along the rotational direction of the turntable 2. Each of the concave portions 24 has an inner diameter that is slightly (e.g., from 1 mm to 4 mm) greater than the diameter of the wafer W. The depth of the concave portion 24 is substantially the same as or greater than the thickness of the wafer W. Accordingly, when the wafer W is placed in the concave portion 24, the height of the upper surface of the wafer W becomes substantially the same as or lower than the height of the upper surface of the turntable 2 where the wafers W are not placed. When the depth of the concave portion 24 is excessively greater than the thickness of the wafer W, it may adversely affect film deposition.

Therefore, the depth of the concave portion 24 is preferably less than or equal to about three times the thickness of the wafer W. Through holes (not illustrated in the drawings) are formed in the bottom of the concave portion 24 to allow a plurality of (e.g., three) lifting pins (which are described later) to pass through. The lifting pins raise and lower the wafer W.

As illustrated in FIG. 2, a first process area P1 and a second process area P2 are provided apart from each other along the rotational direction of the turntable 2. Because the second process area P2 is a plasma process area, it may be also referred to as a plasma process area P2 hereinafter. A plurality of (e.g., seven) gas nozzles 31, 32, 33, 34, 35, 41, and 42 made of, for example, quartz are arranged at intervals in a circumferential direction of the vacuum chamber 1. The gas nozzles 31, 32, 33, 34, 35, 41, and 42 extend radially, and are disposed to face areas that the concave portions 24 of the turntable 2 pass through. The nozzles 31, 32, 33, 34, 35, 41, and 42 are placed between the turntable 2 and the top plate 11. Here, each of the gas nozzles 31, 32, 33, 34, 41, and 42 extends horizontally from the outer wall of the vacuum chamber 1 toward the central area C so as to face the wafers W. On the other hand, the gas nozzle 35 extends from the outer wall of the vacuum chamber 1 toward the central area C, and then bends and extends linearly along the central area C in a counterclockwise fashion (opposite direction of the rotational direction of the turntable 2). In the example of FIG. 2, plasma processing gas nozzles 33 and 34, a plasma processing gas nozzle 35, a separation gas nozzle 41, a first process gas nozzle 31, a separation gas nozzle 42 and a second process gas nozzle 32 are arranged in a clockwise fashion (the rotational direction of the turntable 2) from a transfer opening 15 in this order. Here, the second process gas nozzle 32 is a gas nozzle used as necessary depending on a type of substrate process, and may be provided as necessary. Also, the plasma processing gas nozzles 34 and 35 among the plasma processing gas nozzle 33 through 35 are needed when adjustment of the amount of plasma processing within a surface of the wafer W is performed by adjusting the supply of the plasma processing gas, but are not needed when the adjustment of the amount of the plasma processing within the surface of the wafer W is performed by changing the height of the top plate 11 in the plasma process area P2 or the height of the turntable 2. Hence, the plasma processing gas nozzles 34 and 35 may be provided as necessary.

Although the embodiment illustrates an example of providing the plurality of gas nozzles in the plasma process area P2, one nozzle may be provided for each process area. For example, as illustrated in FIG. 2, the plasma processing gas nozzles 33 through 35 are arranged in the second process area P2, and at least one of the plasma processing gas nozzles 33 through 35 may supply argon gas, and the other of the plasma processing gas nozzles 33 through 35 may supply oxygen gas. Alternatively, only the plasma processing gas nozzle 33 is provided in the plasma process area P2, and may supply a mixed gas of argon gas and oxygen gas. Further alternatively, all of the plasma processing gas nozzles 33 through 35 are provided in the plasma process area P2, and each of the plasma processing gas nozzles 33 through 35 may supply the mixed gas of argon gas and oxygen gas.

The first process gas nozzle 31 forms a "first process gas supply part". Each of the plasma processing gas nozzles 33, 34, and 35 forms a "plasma processing gas supply part". Each of the separation gas nozzles 41 and 42 forms a "separation gas supply part".

Each of the gas nozzles 31, 32, 33, 34, 35, 41, and 42 is connected to gas supply sources (not illustrated in the drawings) via a flow control valve.

Gas discharge holes 36 for discharging a gas are formed in the lower side (which faces the turntable 2) of each of the nozzles 31, 32, 33, 34, 35, 41, and 42. The gas discharge holes 36 are formed, for example, at regular intervals along the radial direction of the turntable 2. The distance between the lower end of each of the nozzles 31, 32, 33, 34, 35, 41, and 42 and the upper surface of the turntable 2 is, for example, from about 1 mm to about 5 mm.

An area below the first process gas nozzle 31 is a first process area P1 where a first process gas is adsorbed on the wafer W. An area below the plasma processing gas nozzles 33 through 35 is a second process area P2 where a thinning (etching) process or a modification process is performed on a film on the wafer W. The separation gas nozzles 41 and 42 are used to form separation areas D for separating the first process area P1 and the second process area P2 from each other.

Figure 3:
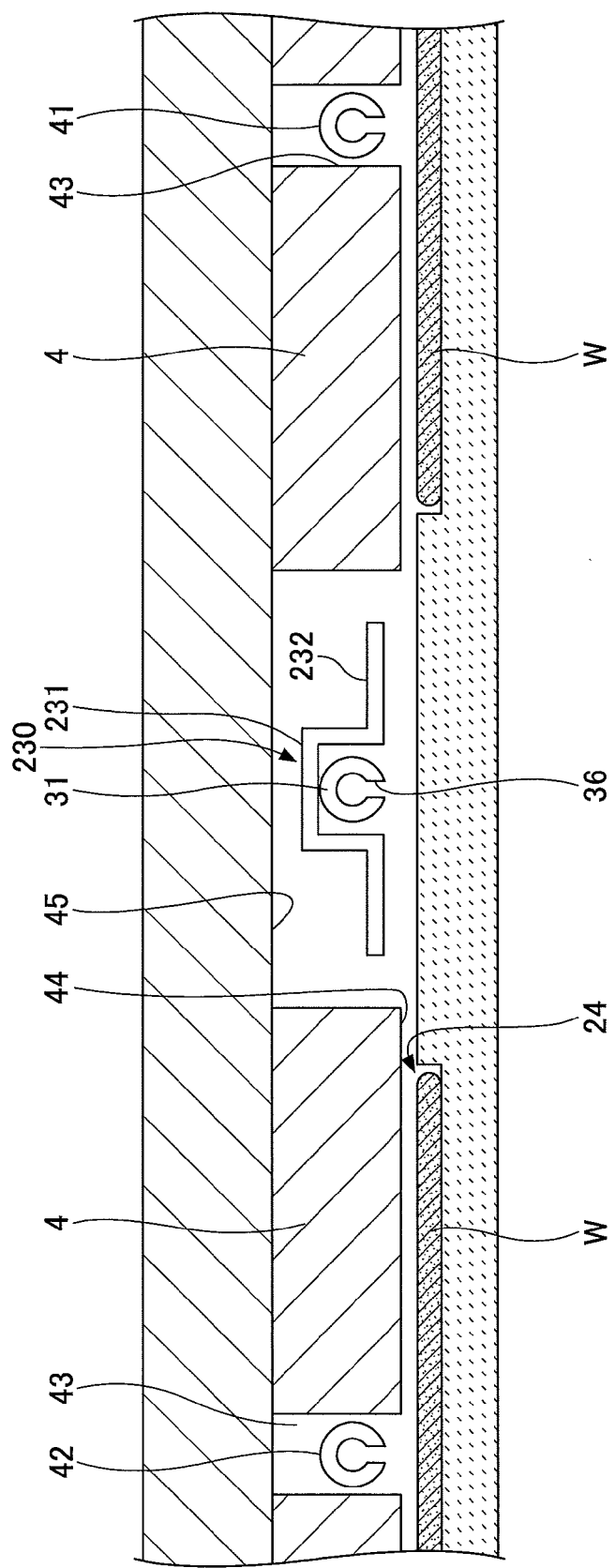
FIG. 3 is a cross-sectional view of a part of a plasma processing apparatus taken along a concentric circle of a turntable.

FIG. 3 illustrates a cross section of a part of the substrate processing apparatus taken along a concentric circle of the turntable 2. More specifically, FIG. 3 illustrates a cross section of a part of the substrate processing apparatus from one of the separation areas D through the first process area P1 to the other one of the separation areas D.

Approximately sectorial convex portions 4 are provided on the lower surface of the top plate 11 of the vacuum chamber 1 at locations corresponding to the separation areas D. The convex portions 4 are attached to the back surface of the top plate 11. In the vacuum chamber 1, flat and low ceiling surfaces 44 (first ceiling surfaces) are formed by the lower surfaces of the convex portions 4, and ceiling surfaces 45 (second ceiling surfaces) are formed by the lower surface of the top plate 11. The ceiling surfaces 45 are located on both sides of the ceiling surfaces 44 in the circumferential direction, and are located higher than the ceiling surfaces 44.

As illustrated in FIG. 2, each of the convex portions 4 forming the ceiling surface 44 has a sectorial planar shape whose apex is cut off to form an arc-shaped side. Also, a groove 43 extending in the radial direction is formed in each of the convex portions 4 at the center in the circumferential direction. Each of the separation gas nozzles 41 and 42 is placed in the groove 43. A peripheral part of the convex portion 4 (a part along the outer edge of the vacuum chamber 1) is bent to form an L-shape to prevent the process gases from mixing with each other. The L-shaped part of the convex portion 4 faces the outer end face of the turntable 2 and is slightly apart from the chamber body 12.

A nozzle cover 230 is provided above the first process gas nozzle 31. The nozzle cover 230 causes the first process gas to flow along the wafer W, and causes the separation gas to flow near the top plate 11 instead of near the wafer W. As illustrated in FIG. 3, the nozzle cover 230 includes an approximately-box-shaped cover 231 having an opening in the lower side to accommodate the first process gas nozzle 31, and current plates 232 connected to the upstream and downstream edges of the opening of the cover body 231 in the rotational direction of the turntable 2. A side wall of the cover body 231 near the rotational center of the turntable 2 extends toward the turntable 2 to face a tip of the first process gas nozzle 31. Another side wall of the cover 231 near the outer edge of the turntable 2 is partially cut off so as not to interfere with the first process gas nozzle 31.

As illustrated in FIG. 2, a plasma generator 81 is provided above the plasma processing gas nozzles 33 through 35 to convert a plasma processing gas discharged into the vacuum chamber 1 into plasma.

Figure 4:
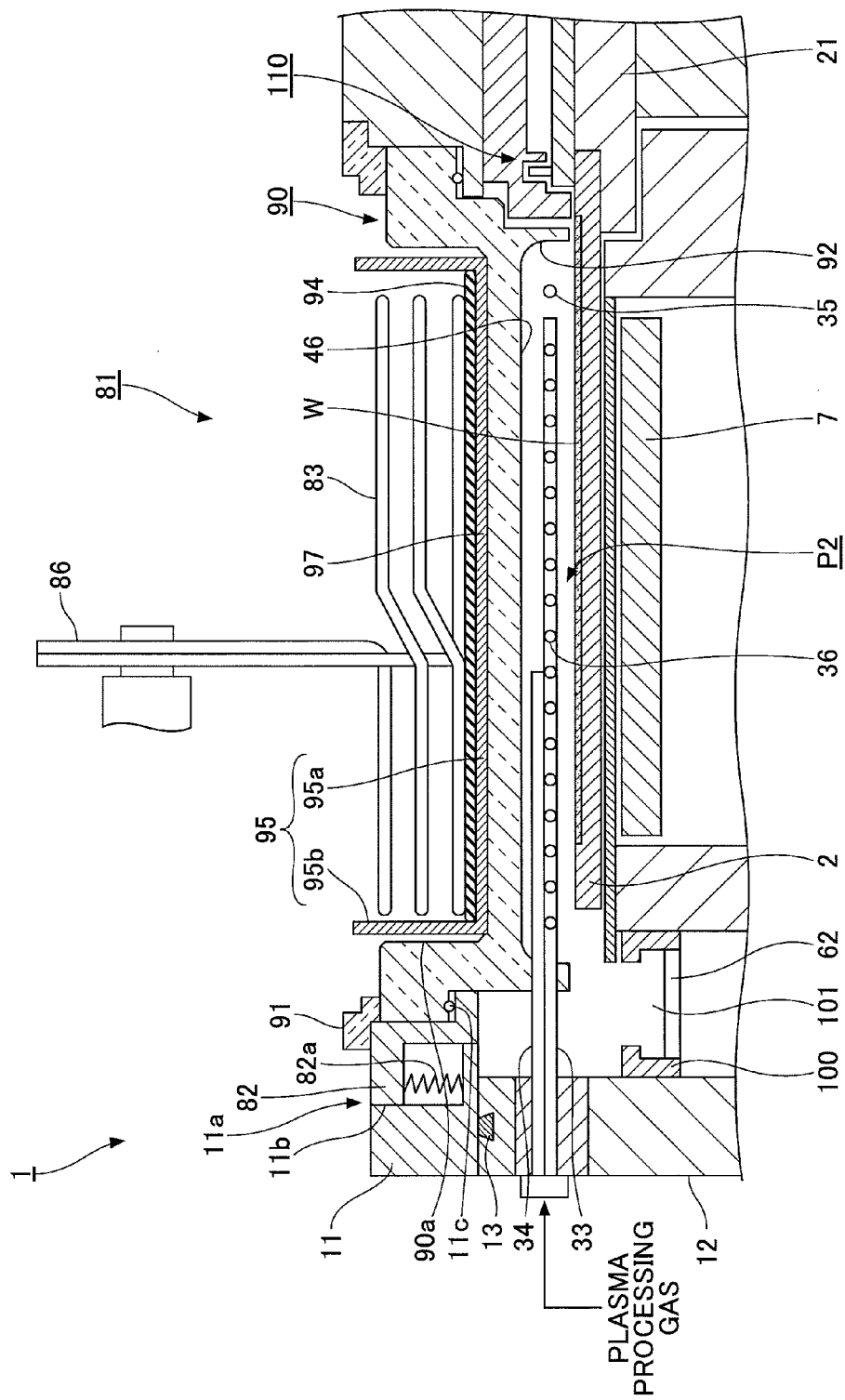
FIG. 4 is a vertical cross-sectional view of an example of a plasma generator of a plasma processing apparatus according to an embodiment of the present invention.
Figure 5:
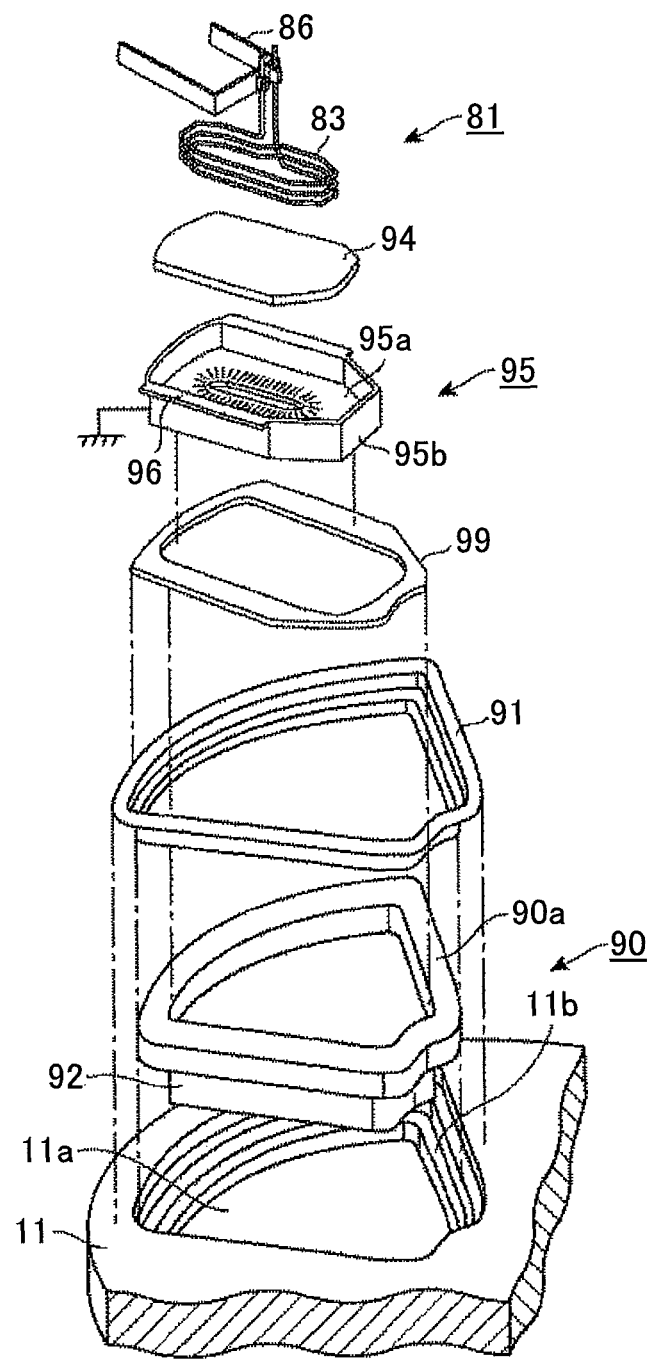
FIG. 5 is an exploded perspective view of an example of a plasma generator of a plasma processing apparatus according to an embodiment of the present invention.
Figure 6:
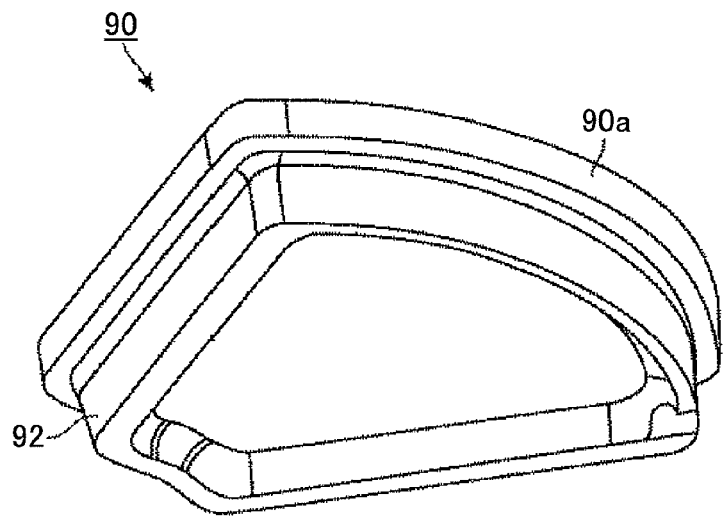
FIG. 6 is a perspective view of an example of a housing of a plasma generator of a plasma processing apparatus according to an embodiment of the present invention.

FIG. 4 is a vertical cross-sectional view of an example of the plasma generator 81. FIG. 5 is an exploded perspective view of an example of the plasma generator 81. FIG. 6 is a perspective view of an example of a housing 90 of the plasma generator 81.

The plasma generator 81 is configured by winding an antenna 83 made of a metal wire or the like, for example, three times around a vertical axis in a coil form. In plan view, the plasma generator 81 is disposed to surround a strip-shaped area extending in the radial direction of the turntable 2 and to extend across the diameter of the wafer W on the turntable 2.

The antenna 83 is connected through a matching box 84 to a high frequency power source 85 that has, for example, a frequency of 13.56 MHz and output power of 5000 W. The antenna 83 is hermetically separated from the inner area of the vacuum chamber 1. As illustrated in FIGS. 1, 2, and 4, a connection electrode 86 electrically connects the antenna 83, the matching box 84, and the high frequency power source 85.

As illustrated in FIGS. 4 and 5, an opening 11a having an approximately sectorial shape in plan view is formed in the top plate 11 above the plasma processing gas nozzles 33 through 35.

As illustrated in FIG. 4, a ring-shaped member 82 is hermetically attached to the periphery of the opening 11a. The ring-shaped member 82 extends along the periphery of the opening 11a. The housing 90 is hermetically attached to the inner circumferential surface of the ring-shaped member 82. That is, the outer circumferential surface of the ring-shaped member 82 faces an inner surface 11b of the opening 11a of the top plate 11, and the inner circumferential surface of the ring-shaped member 82 faces a flange part 90a of the housing 90. The housing 90 is placed via the ring-shaped member 82 in the opening 11a to enable the antenna 83 to be placed at a position lower than the top plate 11. The housing 90 may be made of a dielectric material such as quartz.

As illustrated in FIG. 4, the ring-shaped member 82 includes a bellows 82a that can expand and contract in the vertical direction. The plasma generator 81 is configured to be moved upward and downward by a drive mechanism (elevating mechanism) (not illustrated in the drawings) such as an electric actuator. The bellows 82 expands and contracts as the plasma generator 81 moves upward and downward. This configuration makes it possible to change the distance between the plasma generator 81 and the wafer W (i.e., the turntable 2) during a plasma process. The distance between the plasma generator 81 and the turntable 2 may be hereinafter referred to as a "distance of plasma generating space". The distance between the plasma generator 81 and the turntable 2 is changeable in a range of, for example, 20 mm to 120 mm by the electric actuator and the bellows 82a.

In the embodiment, the distance between the plasma generator 81 and the wafer W is adjusted by moving the plasma generator 81 upward and downward via the bellows 82a. However, the present invention is not limited to the above embodiment. For example, a pedestal (i.e., the turntable 2) on which the wafer W is placed may be configured to move upward and downward to change the distance between the plasma generator 81 and the wafer W. In this case, preferably, a bellows that can expand and contract in the vertical direction may be provided as a component constituting a rotational shaft of the turntable 2 so that a surface on which the wafer W is placed (i.e., a surface of the turntable 2 on which the wafer W is placed) can be moved upward and downward. For example, as illustrated in FIG. 1, a bellows 16 that can expand and contract in the vertical direction may be provided between the bottom part 14 of the vacuum chamber 1 and the case body 20, and the turntable 2 on which the wafer W is placed may be moved upward and downward by an elevating mechanism (not illustrated in the drawings). The bellows 16 expands and contracts as the turntable 2 is moved upward and downward to change the distance between the plasma generator 81 and the wafer W. By providing a bellows as a component of the rotational shaft of the turntable 2, it is possible to change the distance between the plasma generator 81 and the wafer W while keeping a process surface of the wafer W horizontal.

As illustrated in FIG. 6, an upper peripheral part surrounding the entire circumference of the housing 90 extends horizontally to form the flange part 90a. Moreover, a central part of the housing 90 in plan view is recessed toward the inner area of the vacuum chamber 1.

The housing 90 is arranged so as to extend across the diameter of the wafer W in the radial direction of the turntable 2 when the wafer W is located under the housing 90. A seal member 11c such as an O-ring is provided between the ring-shaped member 82 and the top plate 11.

The internal atmosphere of the vacuum chamber 1 is hermetically sealed by the ring-shaped member 82 and the housing 90. The ring-shaped member 82 and the housing 90 are placed in the opening 11a, and the entire circumference of the housing 90 is pressed downward via a frame-shaped pressing member 91 that is placed on the upper surfaces of the ring-shaped member 82 and the housing 90 and extends along a contact region between the ring-shaped member 82 and the housing 90. The pressing member 91 is fixed to the top plate 11 with, for example, bolts (not illustrated in the drawing). As a result, the internal atmosphere of the vacuum chamber 1 is sealed hermetically. In FIG. 5, a depiction of the ring-shaped member 82 is omitted for simplification.

As illustrated in FIG. 6, the housing 90 also includes a protrusion 92 that extends along the circumference of the housing 90 and protrudes vertically from the lower surface of the housing 90 toward the turntable 2. The protrusion 92 surrounds the second process area P2 below the housing 90. The plasma processing gas nozzles 33 through 35 are accommodated in an area surrounded by the inner circumferential surface of the protrusion 92, the lower surface of the housing 90, and the upper surface of the turntable 2. A part of the protrusion 92 near a base end (at the inner wall of the vacuum chamber 1) of each of the plasma processing gas nozzles 33 through 35 is cut off to form an arc-shaped cut-out that conforms to the outer shape of each of the plasma processing gas nozzles 33 through 35.

As illustrated in FIG. 4, on the lower side (i.e., the second process area P2) of the housing 90, the protrusion 92 is formed along the circumference of the housing 90. The protrusion 92 prevents the seal member 11c from being directly exposed to plasma, i.e., isolates the seal member 11c from the second process area P2. This causes plasma to pass through an area under the protrusion 92 even when plasma spreads from the second process area P2 toward the seal member 11c, thereby deactivating the plasma before reaching the seal member 11c.

Figure 7:
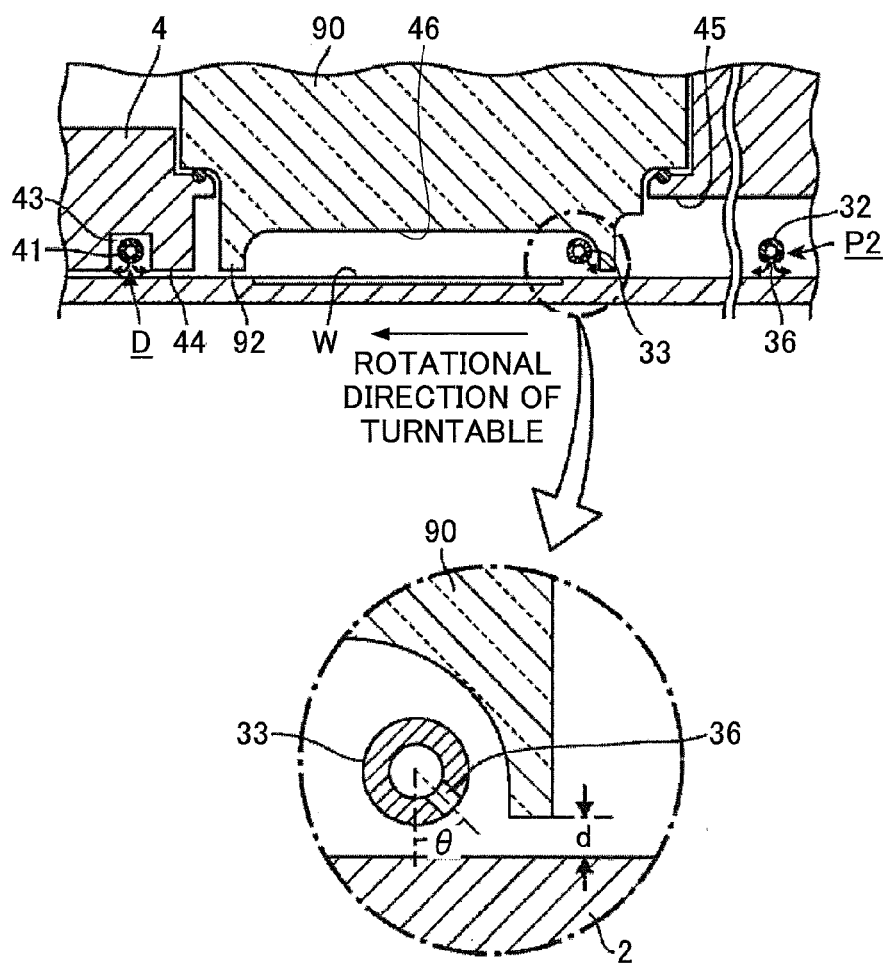
FIG. 7 is a vertical cross-sectional view of a vacuum chamber taken along a rotational direction of a turntable of a plasma processing apparatus according to an embodiment of the present invention.

FIG. 7 is a vertical cross-sectional view of the vacuum chamber 1 taken along the rotational direction of the turntable 2. As illustrated in FIG. 7, because the turntable 2 rotates in a clockwise fashion during the plasma process, $N_2$ gas is likely to intrude into an area under the housing 90 from a clearance between the turntable 2 and the protrusion 92 by being brought by the rotation of the turntable 2. To prevent N$_2$ gas from intruding into the area under the housing 90 through the clearance, a gas is discharged to the clearance from the area under the housing 90. More specifically, as illustrated in FIGS. 4 and 7, the gas discharge holes 36 of the plasma processing gas nozzle 34 are arranged to face the clearance, that is, to face the upstream side in the rotational direction of the turntable 2 and downward. A facing angle θ of the gas discharge holes 36 of the plasma processing gas nozzle 33 relative to the vertical axis may be, for example, about 45 degrees as illustrated in FIG. 7, or may be about 90 degrees so as to face the inner side wall of the protrusion 92. In other words, the facing angle θ of the gas discharge holes 36 may be set at an appropriate angle capable of properly preventing the intrusion of N$_2$ gas in a range from 45 to 90 degrees depending on the intended use.

Figure 8:
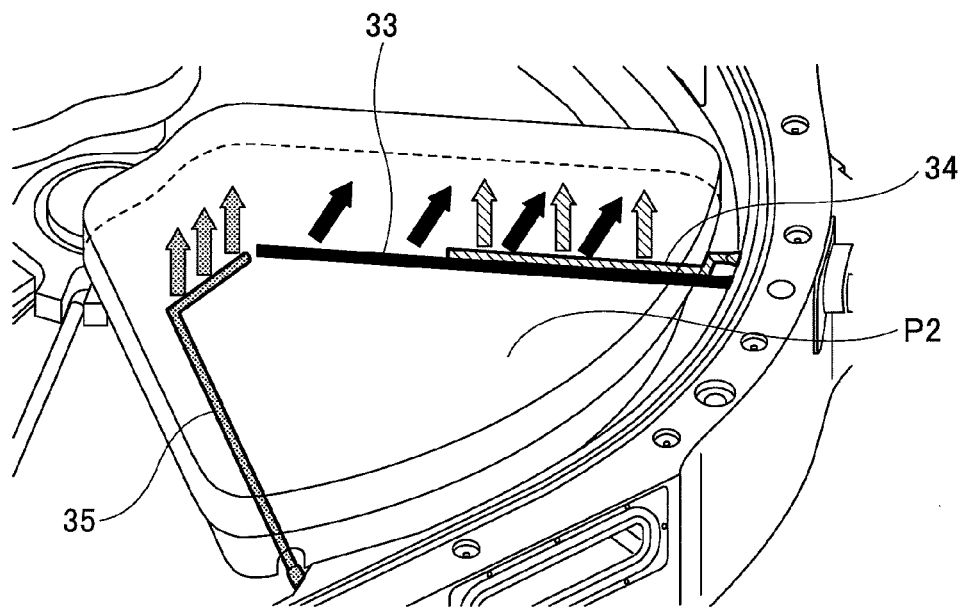
FIG. 8 is an enlarged perspective view of a plasma processing gas nozzle provided in a plasma process area of a plasma processing apparatus according to an embodiment of the present invention.

FIG. 8 is an enlarged perspective view illustrating the plasma processing gas nozzles 33 through 35 provided in the plasma process area P2. As illustrated in FIG. 8, the plasma processing gas nozzle 33 is a nozzle capable of covering the whole of the concave portion 24 in which the wafer W is placed, and supplying a plasma processing gas to the entire surface of the wafer W. On the other hand, the plasma processing gas nozzle 34 is a nozzle provided slightly above the plasma processing gas nozzle 33 so as to approximately overlap with the plasma processing gas nozzle 33. The length of the plasma processing gas nozzle 34 is about half the length of the plasma processing gas nozzle 33. The plasma processing gas nozzle 35 extends from the outer peripheral wall of the vacuum chamber 1 along the radius of the downstream side of the sectorial plasma process area P2 in the rotational direction of the turntable 2, and has a shape bent linearly along the central area C after reaching the neighborhood of the central area C. Hereinafter, for convenience of distinction, the plasma processing gas nozzle 33 covering the whole area may be referred to as a base nozzle 33, and the plasma processing gas nozzle 34 covering only the outer area may be referred to as an outer nozzle 34. Also, the plasma processing gas nozzle 35 extending to the inside may be referred to as an axis-side nozzle 35.

The base nozzle 33 is a gas nozzle for supplying a plasma processing gas to the whole surface of the wafer W. As illustrated in FIG. 7, the base gas nozzle 33 discharges the plasma processing gas toward the protrusion 92 forming the side surface separating the plasma process area P2 from the other area.

On the other hand, the outer nozzle 34 is a nozzle for supplying a plasma processing gas selectively to an outer area of the wafer W. The plasma processing gas supplied to the plasma process area P2 is converted to plasma by passing through the highest part of the plasma process area P2, which is also close to the plasma generator 81. More specifically, because the plasma generator 81 is provided above the plasma process area P2, the plasma processing gas flowing along a ceiling surface 46 (see FIG. 7) of the plasma process area P2 is converted to the plasma, which contributes to the plasma process. In other words, the neighborhood of the ceiling surface 46 of the plasma process area P2 forms a plasma generation area, and the plasma processing gas having passed the plasma generation area is properly converted to the plasma. The outer nozzle 34 performs a process of increasing a flow rate of a plasma processing gas supplied from the outer nozzle 34 and a flow speed of the plasma processing gas of an outer area when obtaining an amount of plasma processing performed on a film deposited on the wafer W after the plasma process and an result of the amount of plasma processing insufficient in the outer area. As the flow speed of the plasma processing gas increases, the amount of plasma processing gas converted to the plasma per unit time increases, which accelerates the plasma process. Accordingly, based on this perspective, the gas discharge holes 36 (not illustrated in the drawings) of the outer nozzle 34 are provided to face upward and the ceiling surface 46 of the plasma processing area P2, and are configured to lead the supplied plasma processing gas to the ceiling surface 46 of the plasma process area P2.

The axis-side nozzle 35 is a nozzle for supplying a plasma processing gas selectively to an area near the axis of the turntable 2 of the wafer W. Hence, the gas discharge holes 36 (not illustrated in the drawings) are formed only in a part of the tip of the axis-side nozzle 35 extending along the central area C, and are configured to supply the plasma processing gas to the area near the axis of the turntable 2 of the wafer W. In the axis-side nozzle 35, the gas discharge holes 36 also face upward and are provided at a location facing the ceiling surface 46 of the plasma process area P2. This causes the plasma processing gas supplied from the axis-side nozzle 35 to immediately flow toward the plasma generation area and to be converted to plasma efficiently. In the event that an insufficient plasma process on the wafer W in the area near the axis of the turntable 2 is found when obtaining a processing distribution within a surface of a film on the wafer W after the plasma process, by increasing a flow rate and a flow speed of the plasma processing gas supplied from the axis-side nozzle 35, the plasma process on the wafer W in the area near the axis of the turntable 2 can be urged.

In this manner, by providing the outer nozzle 34 and the axis-side nozzle 35 in addition to the base nozzle 33, the flow speed of the plasma processing gas can be adjusted for each area, which makes it possible to adjust the amount of processing on a film on the wafer W within its surface.

The adjustment of the amount of processing within the surface of the wafer W is generally performed to improve a uniformity of the plasma process across the surface of the wafer W, but when making a difference of the amount of plasma processing for each area is desired, the purpose can be implemented by increasing the flow rate of the plasma processing gas supplied from the nozzles 34 and 35 to the target area expected to be processed more so as to increase the flow speed. Accordingly, in addition to the improvement of the process uniformity across the surface of the wafer W, a variety of adjustments of the amount of processing is possible.

Furthermore, because the flow rate of the outer nozzle 34 and the axis-side nozzle 35 are relative to each other, the adjustment of decreasing the flow rate of the plasma processing gas from the plasma processing nozzles 34 and 35 to an area expected to be processed less is naturally possible.

In this manner, by providing the plasma processing gas nozzles 34 and 35 for flow rate adjustment for each area, the adjustment of the amount of plasma processing within the surface can be performed readily and accurately. In FIG. 8, although an example of including three of the plasma processing gas nozzles 33 through 35 is illustrated, the adjustment of the amount of processing within the surface may be performed more finely and accurately by installing more plasma processing gas nozzles. The number, a shape, an installation location and the like of the plasma processing gas nozzles 33 through 35 can be changed depending on the intended use.

Such a flow rate of the processing gas in the plasma generation area can be adjusted by changing the height of the ceiling surface 46 of the plasma process area P2. A description is given below of the adjusting method.

As illustrated in FIGS. 1 and 2, the plasma process area P2 includes the exhaust opening 62. Although the exhaust opening 62 naturally evacuates the plasma processing gas within the plasma process area P2, when the exhaust opening 62 and the ceiling surface 46 of the plasma process area P2 are not sufficiently apart from each other, the plasma processing gas flowing along the ceiling surface 46 of the plasma process area P2 is suctioned into the exhaust opening 62 and evacuated from the exhaust opening 62 without passing through the plasma generation area. As illustrated in FIGS. 1 and 2, because the exhaust opening 62 is provided at the outer peripheral side of the turntable 2 and the vacuum chamber 1, when the ceiling surface 46 of the plasma process area P2 is low, the exhaust opening 62 suctions the plasma processing gas flowing the outer peripheral side of the plasma process area P2. In this case, because the flow rate of the plasma processing gas of an outer area of the plasma process area P2 decreases, the flow speed of the outer area of the plasma process area P2 also decreases.

Thus, in such a case, by using the above-mentioned drive mechanism of the plasma generator 81, the plasma generator 81 is raised, and the ceiling surface 46 of the plasma process area P2 is raised, thereby increasing the distance between the ceiling surface 46 and the exhaust opening 62. By doing this, the plasma processing gas on the peripheral side flowing along the ceiling surface 46 of the plasma process area P2 is not influenced by the suction force from the exhaust opening 62, and the flow speed approximately the same as the flow speed of the plasma processing gas in an area on the internal side of the plasma process area P2 can be implemented, thereby improving the uniformity of the plasma process across the surface.

In this way, the adjustment of the flow speed of the plasma processing gas can be performed by adjusting the height of the ceiling surface 46 of the plasma process area P2 in addition to the adjustment of the plurality of plasma processing gas nozzles 33 through 35.

Here, as discussed above, the adjustment of the distance between the turntable 2 and the ceiling surface 46 of the plasma process area P2 can be also performed by adjusting the height of the turntable 2 instead of the height of the ceiling surface 46.

The height of the ceiling surface 46 such that the plasma processing gas flowing in the vicinity of the ceiling surface 46 in the outer area of the plasma process area P2 is not suctioned into the exhaust opening 62 can be preliminarily set when producing the plasma processing apparatus. Hence, the adjustment of the flow speed of the plasma processing gas may be performed when the plasma processing apparatus is designed, in addition to when performing the actual plasma process, and the plasma processing apparatus having high uniformity of the plasma process across the surface of the wafer W may be configured from the beginning.

Moreover, because the adjustment by the plasma processing gas nozzles 33 through 35 and the adjustment or the setting of the height of the plasma process area P2 can be combined with each other, a plasma processing apparatus may be configured that has both functions and can flexibly adjust the amount of processing within the surface.

Next, a detailed description is given below of a Faraday shield 95 of the plasma generator 81. As illustrated in FIGS. 4 and 5, a Faraday shield 95 is provided on the upper side of the housing 90. The Faraday shield 95 is grounded, and is composed of a conductive plate-like part such as a metal plate (e.g., copper plate) that is shaped to roughly conform to the internal shape of the housing 90. The Faraday shield 95 includes a horizontal surface 95a that extends horizontally along the bottom surface of the housing 90, and a vertical surface 95b that extends upward from the outer edge of the horizontal surface 95a and surrounds the horizontal surface 95a. The Faraday shield 95 may be configured to be, for example, a substantially hexagonal shape in a plan view.

Figure 9:
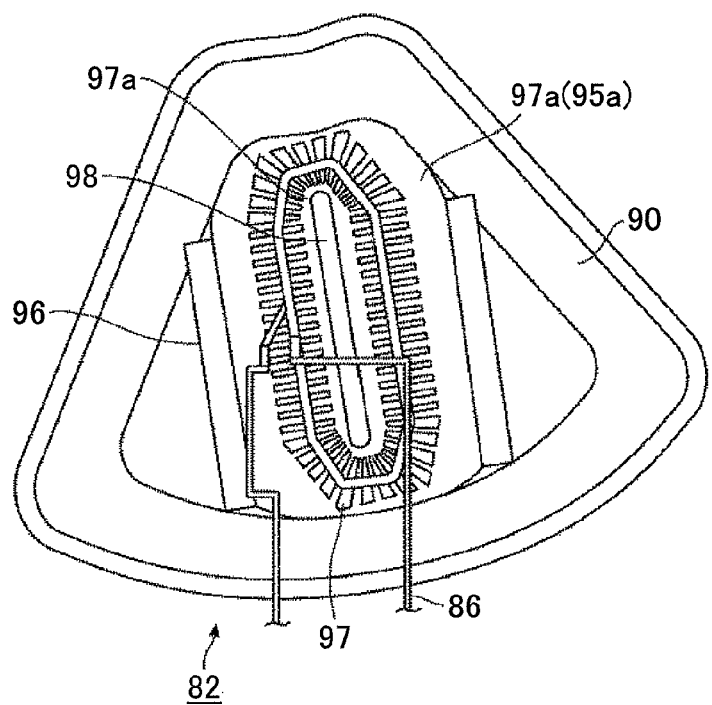
FIG. 9 is a plan view of an example of a plasma generator of a plasma processing apparatus according to an embodiment of the present invention.

FIG. 9 is a plan view of an example of the plasma generator 81. FIG. 8 is a perspective view of a part of the Faraday shield 95 provided in the plasma generator 81.

When seen from the rotational center of the turntable 2, the right and left upper ends of the Faraday shield 95 extend horizontally rightward and leftward, respectively, to form supports 96. A frame 99 is provided between the Faraday shield 95 and the housing 90 to support the supports 96 from below. The frame 99 is supported by a part of the housing 90 near the central area C and a part of the flange part 90a near the outer edge of the turntable 2.

Figure 10:
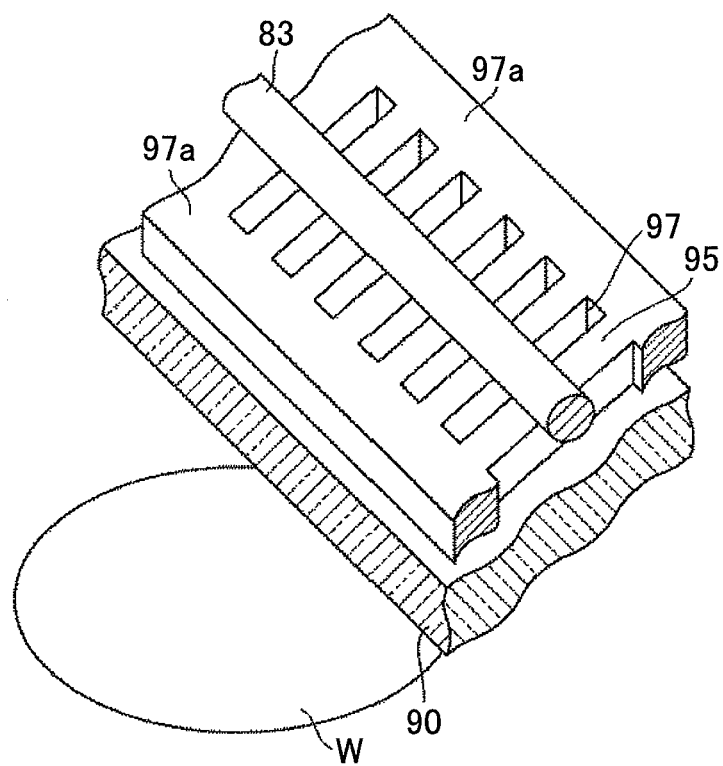
FIG. 10 is a perspective view illustrating a part of a Faraday shield provided in a plasma generator of a plasma processing apparatus according to an embodiment of the present invention.

When an electric field reaches the wafer W, for example, electric wiring and the like formed inside the wafer W may be electrically damaged. To prevent this problem, as illustrated in FIG. 10, a plurality of slits 97 is formed in the horizontal surface 95a. The slits 97 prevent an electric-field component of an electric field and a magnetic field (electromagnetic field) generated by the antenna 83 from reaching the wafer W below the Faraday shield 95, and allow a magnetic field component of the electromagnetic field to reach the wafer W.

As illustrated in FIGS. 9 and 10, the slits 97 extend in directions that are orthogonal to the direction in which the antenna 83 is wound, and are arranged to form a circle below the antenna 83. The width of each slit 97 is set at a value that is about 1/10000 or less of the wavelength of a high frequency supplied to the antenna 83. Circular electrically-conducting paths 97a made of, for example, a grounded conductor are provided at the ends in the length direction of the slits 97 to close the open ends of the slits 97. An opening 98 is formed in an area of the Faraday shield 95 where the slits 97 are not formed, i.e., an area surrounded by the antenna 83. The opening 98 is used to check whether plasma is emitting light. In FIG. 2, the slits 97 are omitted for simplification, but an area where the slits 97 are formed is indicated by a dashed-dotted line.

As illustrated in FIG. 5, an insulating plate 94 is stacked on the horizontal surface 95a of the Faraday shield 95. The insulating plate 94 is made of, for example, quartz having a thickness of about 2 mm, and is used for insulation between the Faraday shield 95 and the plasma generator 81 disposed above the Faraday shield 95. Thus, the plasma generator 81 is arranged to cover the inside of the vacuum chamber 1 (i.e., the wafer W on the turntable 2) through the housing 90, the Faraday shield 95, and the insulating plate 94.

Next, a description is given below of other components of the substrate processing apparatus according to the embodiment.

As illustrated in FIG. 2, a side ring 100, which is a cover, is provided along the outer circumference of the turntable 2 and slightly below the turntable 2. First and second exhaust openings 61 and 62, which are apart from each other in the circumferential direction, are formed in the upper surface of the side ring 100. More specifically, the first and second exhaust openings 61 and 62 are formed in the side ring 100 at locations that correspond to exhaust ports formed in the bottom surface of the vacuum chamber 1.

The first exhaust opening 61 is formed at a location that is between the first process gas nozzle 31 and the separation area D located downstream of the first process gas nozzle 31 in the rotational direction of the turntable 2, and is closer to the separation area D than to the first process gas nozzle 31. The second exhaust opening 62 is formed at a location that is between the plasma generator 81 and the separation area D located downstream of the plasma generator 81 in the rotational direction of the turntable 2, and is closer to the separation area D than to the plasma generator 81.

The first exhaust opening 61 is configured to exhaust the first process gas and the separation gas, and the second exhaust opening 62 is configured to exhaust the plasma processing gas and the separation gas. Each of the first exhaust opening 61 and the second exhaust opening 62 is connected to a vacuum pump 64 that is an example of an evacuation mechanism through an evacuation pipe 63 including a pressure controller 65 such as a butterfly valve.

Here, gases flowing from the upstream in the rotational direction of the turntable 2 to the process area P2 and then flowing toward the second exhaust opening 62 may be blocked by the housing 90 extending from the central area C toward the outer wall of the vacuum chamber 1. For this reason, a groove-like gas flow passage 101 to allow the gases to flow therethrough is formed in the upper surface of the side ring 100 at a location closer to the outer wall of the vacuum chamber 1 than the outer end of the housing 90.

As illustrated in FIG. 1, a protruding portion 5 having a substantially ring shape is formed on a central part of the lower surface of the top plate 11. The protruding portion 5 is connected with the inner ends (that face the central area C) of the convex portions 4. The height of the lower surface of the protruding portion 5 is substantially the same as the height of the lower surfaces (the ceiling surfaces 44) of the convex portions 4. A labyrinth structure 110 is formed above the core portion 21 at a location closer to the rotational center of the turntable 2 than the protruding portion 5. The labyrinth structure 110 prevents gases from mixing with each other in the central area C.

As described above, the housing 90 extends up to a location near the central area C. Therefore, the core portion 21 for supporting the central part of the turntable 2 is formed near the rotational center so that a part of the core portion 21 above the turntable 2 does not contact the housing 90. For this reason, compared with outer peripheral areas, gases are likely to mix with each other in the central area C. The labyrinth structure 110 above the core portion 21 lengthens gas flow passage and thereby prevents gases from mixing with each other.

As illustrated in FIG. 1, a heater unit 7 is provided in a space between the turntable 2 and the bottom part 14 of the vacuum chamber 1. The heater unit 7 can heat, through the turntable 2, the wafer W on the turntable 2 to a temperature, for example, in a range from about room temperature to about 300° C. In FIG. 1, a side covering member 71a is provided on a lateral side of the heater unit 7, and an upper covering member 7a is provided above the heater unit 7 to cover the heater unit 7. Purge gas supply pipes 73 are provided in the bottom part 14 of the vacuum chamber 1 below the heater unit 7. The purge gas supply pipes 73 are arranged at a plurality of locations along the circumferential direction and used to purge the space where the heater unit 7 is placed.

As illustrated by FIG. 2, the transfer opening 15 is formed in the side wall of the vacuum chamber 1. The transfer opening 15 is used to transfer the wafer W between a transfer arm 10 and the turntable 2. A gate valve G is provided to hermetically open and close the transfer opening 15. A camera unit 10a is provided above the top plate 11 in an area where the transfer arm 10 is moved into and out of the vacuum chamber 1. The camera unit 10a is used to detect the outer edge (or rim) of the wafer W. The camera unit 10a captures an image of the outer edge of the wafer W and thereby detects, for example, whether the wafer W is on the transfer arm 10, misalignment of the wafer W on the turntable 2, and misalignment of the wafer W on the transfer arm 10. The camera unit 10a is configured to have a wide field of view that covers the diameter of the wafer W.

The wafer W is transferred between the concave portion 24 of the turntable 2 and the transfer arm 10 when the concave portion 24 is at a position (transfer position) facing the transfer opening 15. For this reason, lifting pins and an elevating mechanism (not illustrated in the drawings) for lifting the wafer W are provided at the transfer position under the turntable 2. The lifting pins pass through the concave portion 24 and push the back surface of the wafer W upward.

The substrate processing apparatus of the embodiment also includes a control unit 120 implemented by a computer for controlling the operations of the entire substrate processing apparatus. The control unit 120 includes a memory that stores a program for causing the substrate processing apparatus to perform a substrate process described later. The program may include steps for causing the substrate process apparatus to perform various operations. The program may be stored in a storage unit 121 that forms a storage medium such as a hard disk, a compact disc, a magneto-optical disk, a memory card, or a flexible disk, and installed from the storage unit 121 into the control unit 120.

<Plasma Processing Method>

Next, a description is given below of a plasma processing method according to an embodiment of the present invention. Although the plasma processing method according to the embodiment can be applied to an etching apparatus and another type of film deposition apparatus in addition to the plasma processing apparatus by ALD described above, a description is given below of an example of implementing the plasma processing method of the embodiment by using the above-mentioned plasma processing apparatus for convenience of explanation.

The plasma processing method of the embodiment can be applied to the following processes and the like:

First Process: a process of thinning a film including carbon and formed on a wafer W (thinning step); and Second Process: a process of depositing a film by ALD on the wafer W and modifying the deposited film (film deposition step and modification step). However, the plasma processing method of the embodiment may be also applied to other types of substrate processes by changing process conditions (e.g., types of gases, gas flow rates, the rotational speed of the turntable 2, the distance between the plasma generator 81 and the turntable 2, pressure, high frequency output, and temperature).

In the exemplary plasma processing method described below, the thinning step, the film deposition step, and the modification step are performed continuously on a wafer W on which a film (e.g., a resist pattern) including a carbon pattern has been formed in advance. Any other type of electric wiring structure may have been formed on the wafer W through a film deposition process and a thinning process.

As the integration degree of semiconductor devices increases, the wiring and the separation width required for a manufacturing process become smaller. In general, a fine pattern is formed by forming a resist pattern including carbon by photolithography, and by etching various underlying thin films using the resist pattern as an etching mask. Accordingly, to form a fine pattern, photolithography techniques are important. However, recent miniaturization of semiconductor devices requires resolution higher than the resolution limit of photolithography. For this reason, in the first process, thinning of a resist pattern is performed to correct dimensions after photolithography.

Also, a fine pattern forming method, which combines a process of depositing a film, for example, a silicon oxide film on a resist pattern, with a process such as a side-wall transfer (SWT) process or a lithography-lithography etching (LLE) process, attracts attention as a technology to form a fine pattern finer than the resolution limit of photolithography. Therefore, in the second process of the embodiment, for example, a silicon oxide film is deposited on the thinned resist pattern (on which thinning has been performed in the first process) through continuous processes in the same chamber (in situ process).

Although a description is given below of an example of applying the plasma processing method of the embodiment to the thinning process and the film deposition process (and the modification process) described above, as discussed above, the present invention is not limited to the example. The plasma processing method of the present invention can be applied to other types of plasma processing methods.

Next, an example of specific processes performed in the first and second processes is described below from a substrate transfer process.

To begin with, to carry substrates such as the wafers W into the vacuum chamber 1, the gate valve G is opened. Next, while the turntable 2 is being rotated intermittently, the wafers W are carried into the vacuum chamber 1 through the transfer opening 15 and placed on the turntable 2 by the transfer arm 10.

<First Process: Thinning (Etching) Step>

Next, the gate valve G is closed, and the pressure in the vacuum chamber 1 is adjusted to a predetermined pressure value by the vacuum pump 64 and the pressure controller 65. Then, the wafers W are heated to a predetermined temperature by the heater unit 7 while rotating the turntable 2.

Subsequently, the distance between the plasma generator 81 and the turntable 2 is set at a predetermined value. Then, while the supply of a process gas from the first process gas nozzle 31 is cut off, plasma processing gases (e.g., argon gas and oxygen gas) are supplied at predetermined flow rates from the plasma processing gas nozzles 33 through 35.

The pressure controller 65 adjusts the pressure in the vacuum chamber 1 to a predetermined pressure value. The plasma generator 81 applies high frequency power of a predetermined output level to the antenna 83. Also, the antenna 83 generates an electric field and a magnetic field (electromagnetic field).

In the housing 90, the electric field of the electromagnetic field generated by the antenna 83 is reflected, absorbed, or attenuated by the Faraday shield 95 and is thereby prevented from entering the vacuum chamber 1.

The Faraday shield 95 includes the electrically-conducting paths 97a at the ends in the length direction of the slits 97, and the vertical surface 95b disposed lateral to the antenna 83. This configuration also blocks the electric field likely to go around the slits 97 and move toward the wafer W through areas at the ends in the length direction of the slits 97.

On the other hand, because the slits 97 are formed in the Faraday shield 95, the magnetic field passes through the slits 97 of the Faraday shield 95, and enters the vacuum chamber 1 through the bottom surface of the housing 90. As a result, the plasma processing gases are converted into plasma by the magnetic field in an area under the housing 90. This makes it possible to generate plasma including many active species that are less likely to electrically damage the wafer W.

Here, an underlying film including carbon is preliminarily formed on the surface of the wafer W. Thus, a certain amount of this underlying film including carbon is etched by the active species (ions and radicals) in the plasma.

Thinning characteristics of the thinning process of the embodiment depend on the distance between the plasma generator 81 and the turntable 2, the types of plasma processing gases, the flow rates of plasma processing gases, the pressure in the vacuum chamber, the output level of the high frequency power source 85, the temperature of the wafer W, and the rotational speed of the turntable 2.

In this manner, to begin with, a distribution of an amount of plasma processing on the wafer W within its surface is obtained by performing the usual thinning process.

Figure 11A:
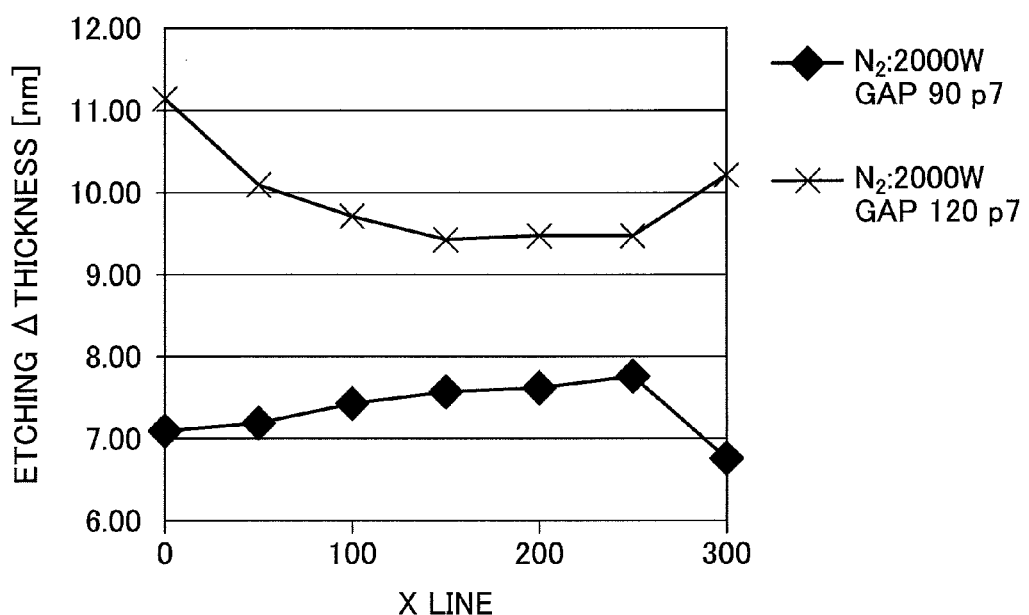
FIGS. 11A and 11B are graphs illustrating an example of a distribution of an amount of thinning processing within a surface in X and Y directions obtained by measurement after the thinning process of a plasma processing method according to an embodiment of the present invention.
Figure 11B:
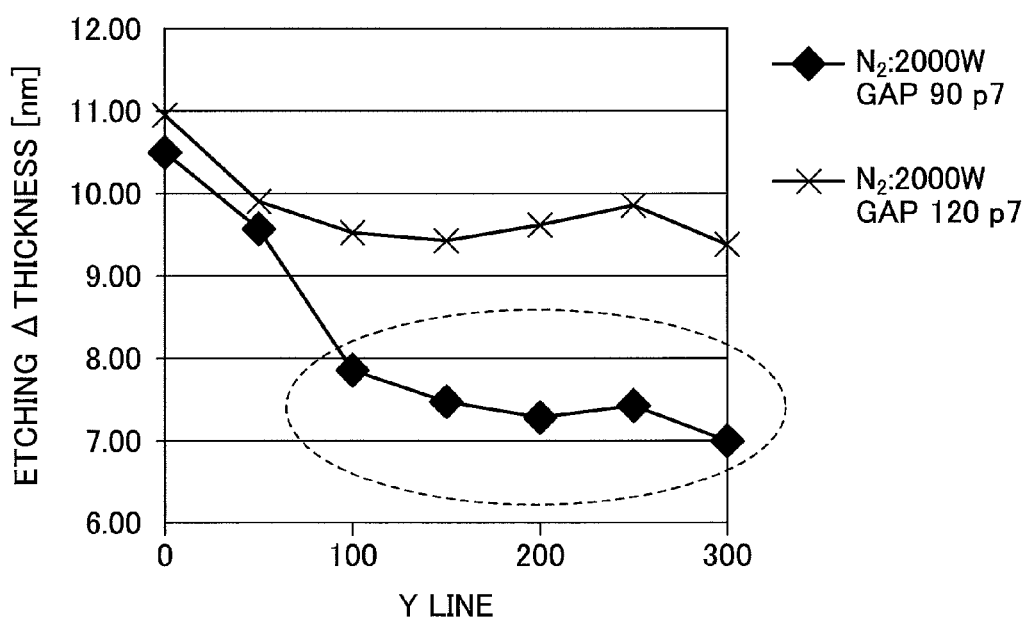

FIGS. 11A and 11B are graphs showing an example of a distribution of an amount of thinning processing within a surface of a wafer W obtained by measurement after the thinning process. FIG. 11A shows the distribution of the amount of thinning processing within the surface of the wafer W in an X direction. FIG. 11B shows the distribution of the amount of thinning processing within the surface of the wafer W in a Y direction. Here, the X direction means a direction along the rotational direction of the turntable 2 (i.e., the circumferential direction), and the Y direction is a direction approximately perpendicular to the rotational direction of the turntable 2 (i.e., the radial direction). In FIGS. 11A and 11B, the horizontal axis indicates a coordinate within the surface of the wafer W, and the vertical axis indicates an amount of etching.

As shown in FIG. 11B, the amount of etching decreases between 100 and 300 mm in the Y direction, compared to the amount of etching between 0 and 100 mm. This means that the amount of thinning on a peripheral side of the wafer W is small.

In such a case, as discussed above, the flow speed of the plasma processing gas on the peripheral side can be increased by increasing the flow rate of the outer nozzle 35 among the plasma processing gas nozzles 33 through 35, or by heightening the ceiling surface 46 of the plasma process area P2. By performing such adjustment, the amount of plasma processing on the wafer W within its surface can be made uniform and the amount of etching can be made uniform.

FIGS. 12A through 12D are simulation diagrams showing distribution differences of the flow speed of the plasma processing gases in a cross section in the radial direction in the plasma process area P2 when changing the distance between the turntable 2 and the ceiling surface of the plasma process area P2.

Figure 12A:
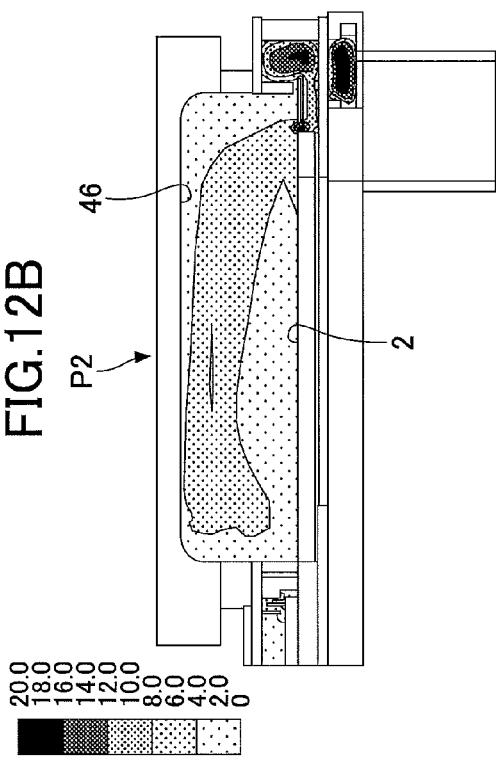
FIGS. 12A through 12D are simulation diagrams illustrating differences of distributions of flow speeds of a plasma processing gas in a cross section in a radial direction in a plasma process area when a distance between a turntable and a ceiling surface of the plasma process area is changed.

FIG. 12A is a diagram showing a distribution of the flow speed of the plasma processing gas when the distance between the turntable 2 and the plasma processing area P2 is 90 mm. FIG. 12A shows the distribution of the flow speed of the plasma processing gas in increments of 4 slm in a range from 0 to 20 slm. In FIG. 12A, the right-side area shows the peripheral area and the left-side area shows the central (axis) area. Here, the positional relationship in the drawings is the same in FIGS. 12B through 12D.

In FIG. 12A, when focusing on the neighborhood of the ceiling surface 46 of the plasma process area P2, which is the plasma generation area, the central area has a flow speed (flow rate) in a range from 4 to 8 slm (standard liter/min), but an area from the middle to the peripheral area has a flow speed in a range from 0 to 4 slm. This means that the flow speed on the peripheral area is lower than that on the central area.

Figure 12B:
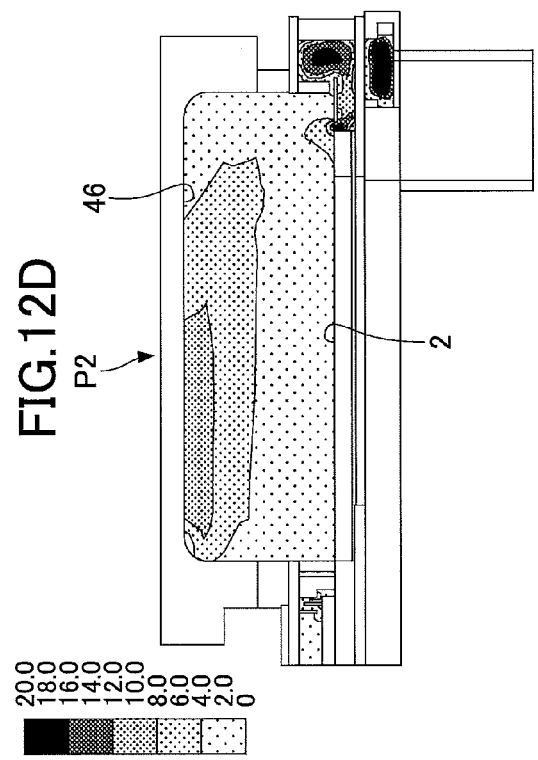

FIG. 12B is a diagram showing a distribution of the flow speed of the plasma processing gas when the distance between the turntable 2 and the plasma processing area P2 is 105 mm. As shown in FIG. 12B, the flow speed in the central area is in a range from 4 to 8 slm, and an area outside the central area is in a range from 0 to 4 slm, which means the flow speed of the peripheral area is lower than that of the central area as well as FIG. 12A.

Figure 12C:
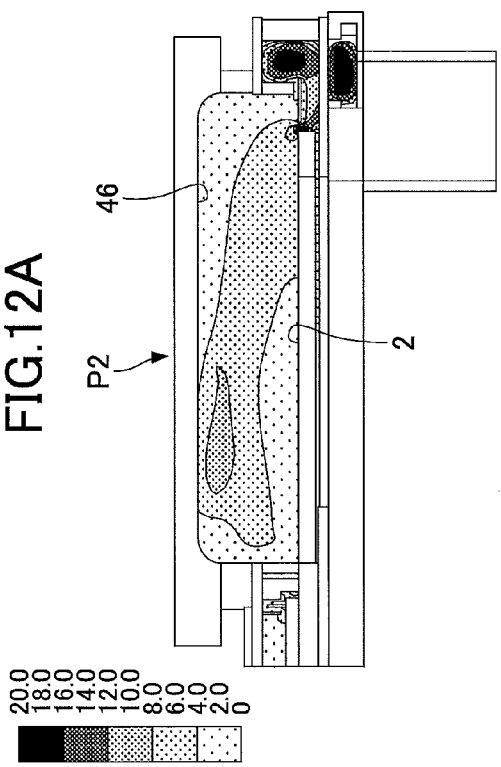

FIG. 12C is a diagram showing a distribution of the flow speed of the plasma processing gas when the distance between the turntable 2 and the plasma processing area P2 is 120 mm. As shown in FIG. 12C, the flow speed of the central area increases, and the flow speed is in a range of 8 to 12 slm on the central side, and in a range of 4 to 8 slm on the peripheral side. The flow speed is made uniform as a whole. Here, the difference of the flow speed is more appropriate to be determined based on the difference of a ratio of the flow rate rather than the difference of absolute values. Thus, inclusion of an area having the flow speed in a range from 0 to 4 slm in the surface to be processed by the plasma process is not in a preferable state. Accordingly, the flow speed in FIG. 12C is made more uniformed than the flow speed in FIG. 12B. Under the flow speed of FIG. 12C, the plasma process can be performed almost uniformly on the whole area of the film deposited on the wafer W.

Figure 12D:
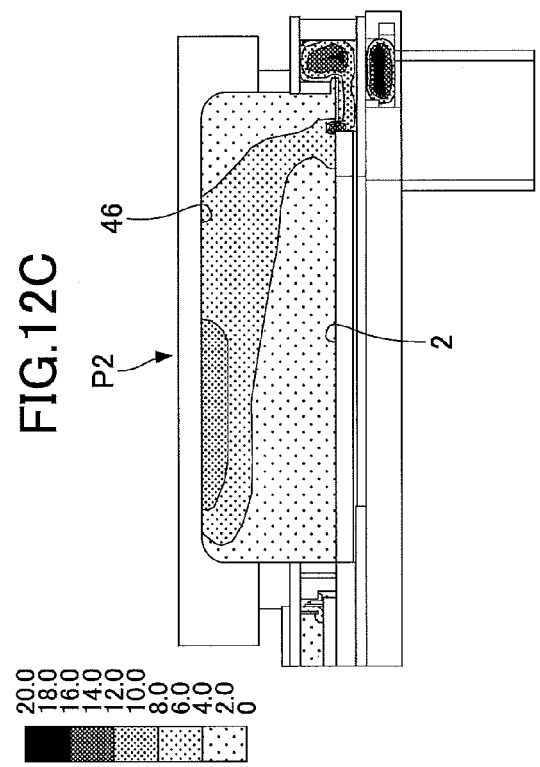

FIG. 12D is a diagram showing a distribution of the flow speed of the plasma processing gas when the distance between the turntable 2 and the plasma processing area P2 is 135 mm. In FIG. 12D, the flow speed is in a range from 8 to 12 slm in the central area, and in a range from 4 to 8 slm in the peripheral area, which indicates more uniform flow speed as a whole than that of FIG. 12C. Accordingly, under the distribution of flow speed under FIG. 12D, the plasma process having a uniform amount of processing across the surface can be performed.

These simulation results are obtained by assuming that the above-discussed plasma processing apparatus in the embodiment is used. Accordingly, the simulation results can be directly applied the plasma processing apparatus of the embodiment. More specifically, the simulation results show that the uniform plasma process can be performed by setting the distance between the turntable 2 and the ceiling surface 46 of the plasma process area P2 at 120 mm or higher when the adjustment of the flow speed of the plasma processing gas is performed only by adjusting the distance between the turntable 2 and the ceiling surface 46 of the plasma process area P2.

In other words, when the distribution of the amount of plasma processing within the surface of the wafer W as shown in FIGS. 11A and 11B, by adjusting the distance between the turntable 2 and the ceiling surface 46 of the plasma process area P2 to 120 mm, the amount of etching on the peripheral side can be increased, and the uniformity of the plasma process across the surface of the wafer W can be improved.

FIGS. 13A through 13D are first through fourth diagrams showing simulation results of paths of flow of the plasma processing gas when changing the distance between the turntable 2 and the ceiling surface 46 of the plasma process area P2.

This simulation is performed under the following conditions: the pressure of the vacuum chamber 1 is 2 Torr; the heating temperature by the heater unit 7 is 85° C.; the rotational speed of the turntable 2 is 120 rpm; the flow rate of Ar gas supplied to the plasma process area P2 is 15 slm; and the flow rate of $O_2$ gas supplied to the plasma process area P2 is 0.5 slm.

Figure 13A:
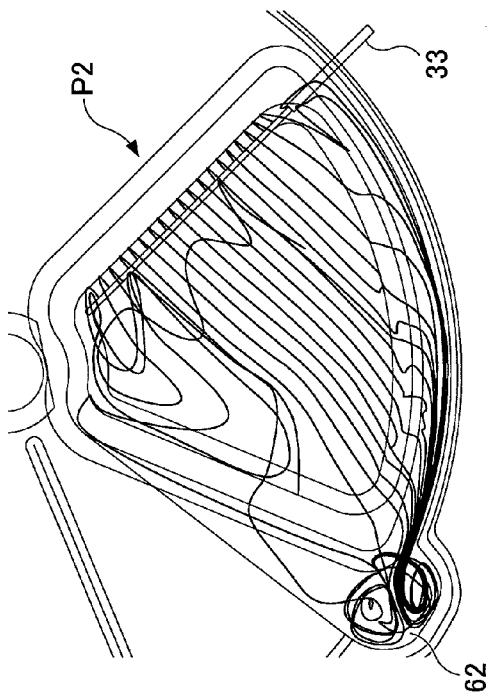
FIGS. 13A through 13D are first through fourth diagrams showing simulation results of paths of flow of a plasma processing gas when changing the distance between the turntable and the ceiling surface in the plasma process area.
Figure 13B:
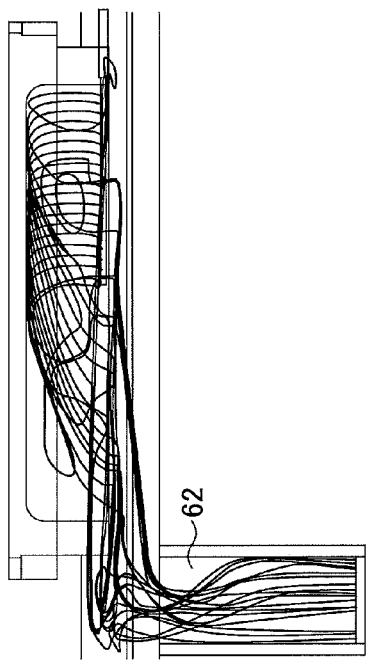

FIG. 13A is a plan view showing a simulation result of paths of flow of the plasma processing gas when the distance between the turntable 2 and the ceiling surface 46 of the plasma process area P2 is set at 90 mm. FIG. 13B is a cross-sectional view approximately taken along the circumferential direction showing the simulation result when the distance between the turntable 2 and the ceiling surface 46 of the plasma process area P2 is set at 90 mm.

FIG. 13A shows the paths of flow of the plasma processing gas supplied from the plasma processing gas nozzle 35 in a planar direction. FIG. 13A shows that the exhaust opening 62 is provided on the downstream side of the plasma process area P2, and that the plasma processing gas supplied from the plasma processing gas nozzle 33 is suctioned into the exhaust opening 62.

FIG. 13B shows the paths of flow of the plasma processing gas supplied from the plasma processing gas nozzle 33 in a vertical direction. FIG. 13B shows that the plasma processing gas supplied from the plasma processing gas nozzle 33 flows along the ceiling surface 46 of the plasma process area P2 at first, but that the plasma processing gas is suctioned into the exhaust opening 62 near the middle and then flows downward.

Figure 13C:
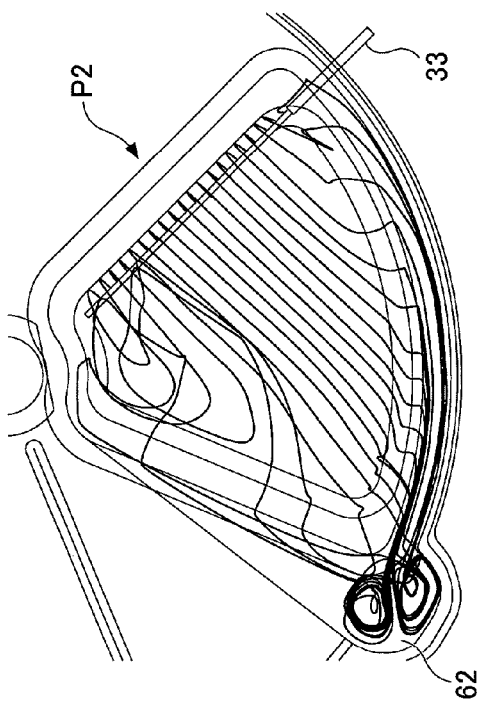
Figure 13D:
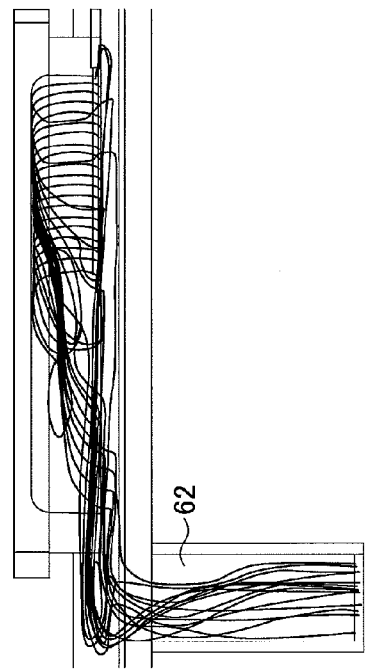

FIG. 13C is a plan view showing a simulation result of paths of flow of the plasma processing gas when the distance between the turntable 2 and the ceiling surface 46 of the plasma process area P2 is set at 105 mm. FIG. 13D is a cross-sectional view approximately taken along the circumferential direction showing the simulation result when the distance between the turntable 2 and the ceiling surface 46 of the plasma process area P2 is set at 105 mm.

The planar paths of flow of the plasma processing gas shown in FIG. 13C does not greatly differ from those in FIG. 13A. In contrast, the paths of flow of the plasma processing gas in the vertical direction shown in FIG. 13D has a larger area where the plasma processing gas flows along the ceiling surface 46 of the plasma process area P2 than that in FIG. 13B, and the plasma processing gas is suctioned into the exhaust opening 62 at a location slightly left of the middle.

FIGS. 14A through 14D are diagrams showing simulation results of paths of flow of the plasma processing gas when changing the distance between the turntable 2 and the ceiling surface 46 of the plasma process area P2. The simulation conditions in FIGS. 14A through 14D are the same as those in FIGS. 13A through 13D.

Figure 14A:
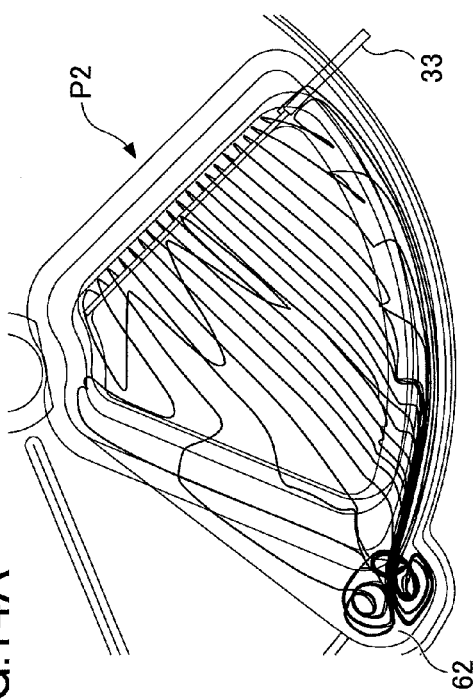
FIGS. 14A through 14D are fifth through eighth diagrams showing simulation results of paths of flow of a plasma processing gas when changing the distance between the turntable and the ceiling surface in the plasma process area.
Figure 14B:
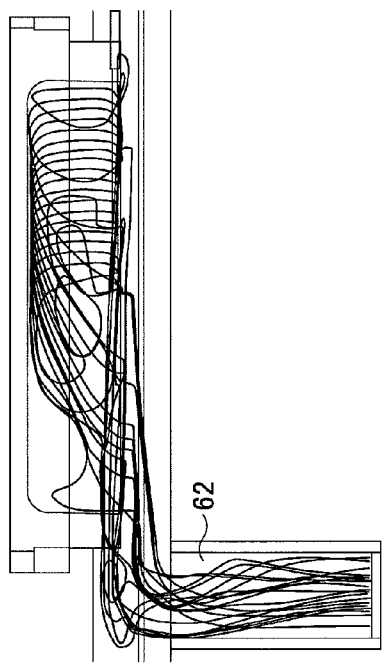

FIG. 14A is a plan view showing a simulation result of paths of flow of the plasma processing gas when the distance between the turntable 2 and the ceiling surface 46 of the plasma process area P2 is set at 120 mm. FIG. 14B is a cross-sectional view approximately taken along the circumferential direction showing the simulation result when the distance between the turntable 2 and the ceiling surface 46 of the plasma process area P2 is set at 120 mm.

The planar paths of flow of the plasma processing gas shown in FIG. 14A does not greatly differ from those in FIGS. 13A and 13C. In contrast, the paths of flow of the plasma processing gas in the vertical direction shown in FIG. 14B has a further larger area where the plasma processing gas flows along the ceiling surface 46 of the plasma process area P2 than that in FIG. 13D, and the area where the plasma processing gas flows along the ceiling surface 46 of the plasma process area P2 covers a range from the right end to about 60% or larger of the whole range.

Figure 14C:
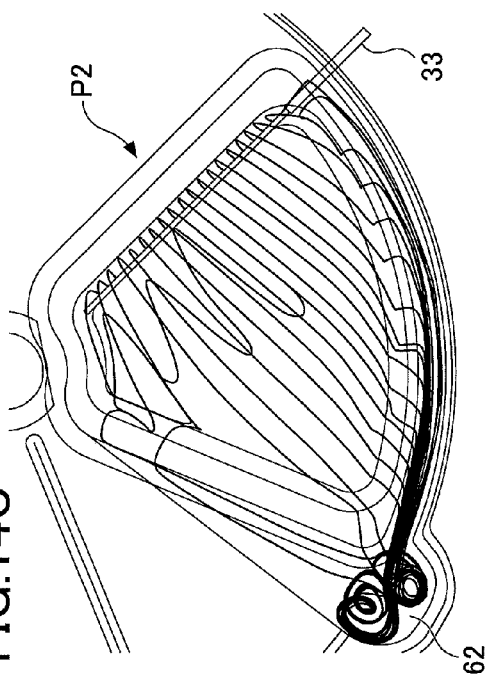
Figure 14D:
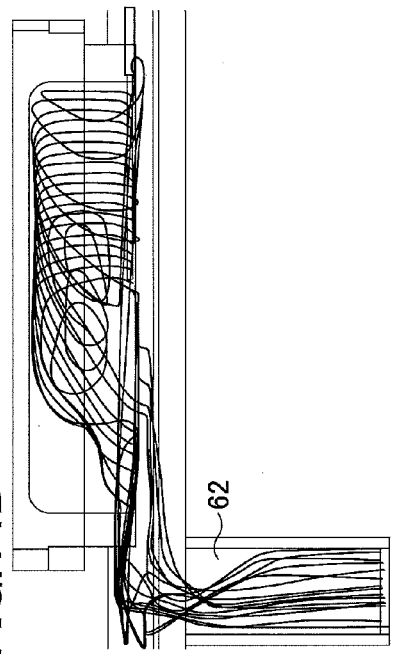

FIG. 14C is a plan view showing a simulation result of paths of flow of the plasma processing gas when the distance between the turntable 2 and the ceiling surface 46 of the plasma process area P2 is set at 135 mm. FIG. 14D is a cross-sectional view approximately taken along the circumferential direction showing the simulation result when the distance between the turntable 2 and the ceiling surface 46 of the plasma process area P2 is set at 135 mm.

The planar paths of flow of the plasma processing gas shown in FIG. 14D does not greatly differ from those in FIGS. 13C and 14A. In contrast, the paths of flow of the plasma processing gas in the vertical direction shown in FIG. 14D has a slightly larger area where the plasma processing gas flows along the ceiling surface 46 of the plasma process area P2 than that in FIG. 14B, and the area where the plasma processing gas flows along the ceiling surface 46 of the plasma process area P2 covers a range from the right end to about 65% or larger of the whole range.

In this manner, as shown in FIGS. 13A through 13D and 14A through 14D, increasing the distance between the turntable 2 and the ceiling surface 46 of the plasma process area P2 can weaken an influence of the suction force from the exhaust opening 62 to the flow of the plasma processing gas, expand the range where the plasma processing gas passes through the plasma generation area, and accelerate the plasma process.

Figure 15A:
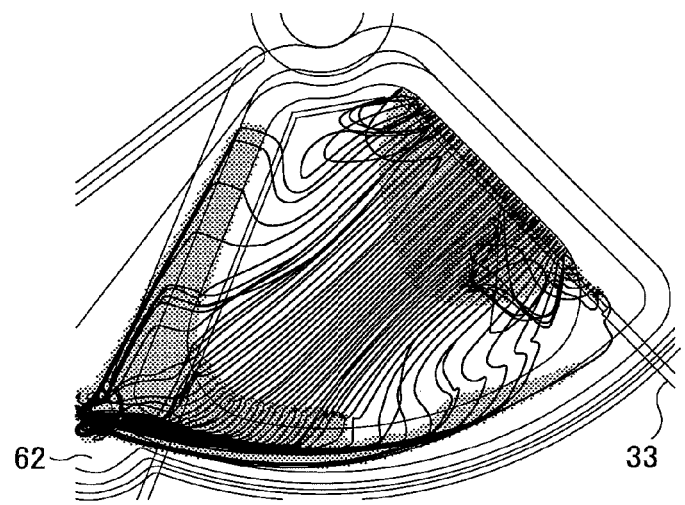
FIGS. 15A through 15C are first through third diagrams showing simulation results of gas flow rate adjustment by a plurality of plasma processing gas nozzles provided in the plasma process area.
Figure 15B:
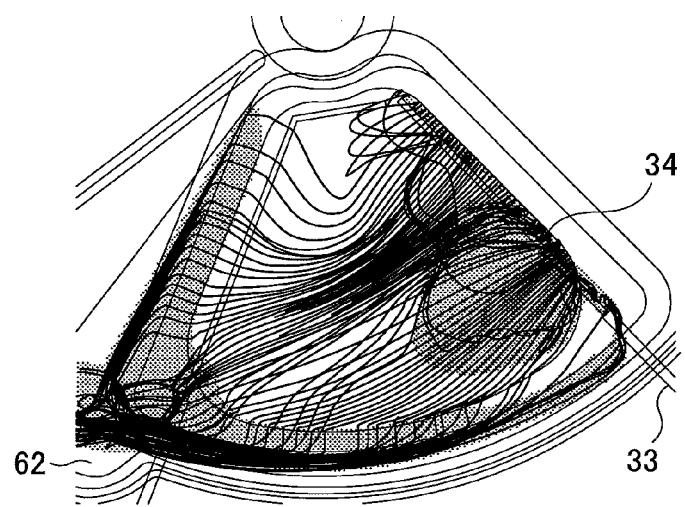
Figure 15C:
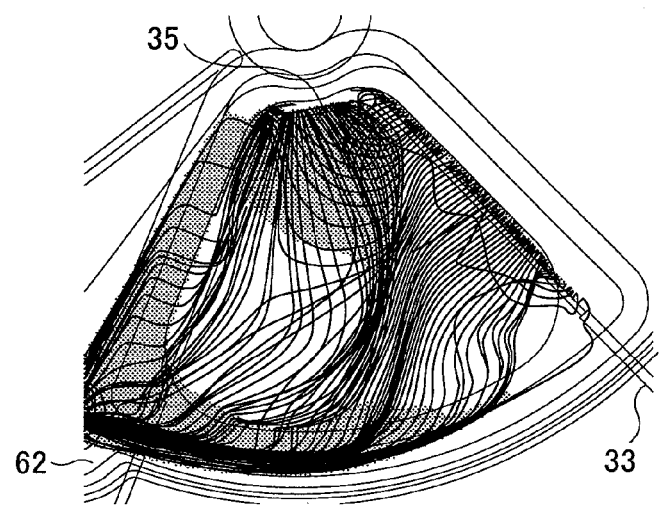

FIGS. 15A through 15C are first through third diagrams showing simulation results of the gas flow rate adjustment by the plurality of plasma processing gas nozzles 33 through 35 provided in the plasma process area P2.

FIG. 15A is a diagram showing a simulation result of paths of flow of the plasma processing gas when supplying 100% of the plasma processing gas from the base nozzle 33. In FIG. 15A, an area having a thick color near the base nozzle 33 is an area where the plasma processing gas has a high flow speed and a great flow rate. These points are the same in FIGS. 15B and 15C. As shown in FIG. 15A, the plasma processing gas is supplied from the whole of the base nozzle 33 and flows toward the exhaust opening 62.

FIG. 15B is a diagram showing a simulation result of paths of flow of the plasma processing gas when supplying 60% of the plasma processing gas from the base nozzle 33 and 40% of the plasma processing gas from the outer nozzle 34. As shown in FIG. 15B, by supplying the plasma processing gas from the outer nozzle 34, the thick colored area is caused in the periphery, and the flow speed and the flow rate of the outer area increase more than those of FIG. 15A.

FIG. 15C is a diagram showing a simulation result of paths of flow of the plasma processing gas when supplying 60% of the plasma processing gas from the base nozzle 33 and 40% of the plasma processing gas from the axis-side nozzle 35. As shown in FIG. 15C, by supplying the plasma processing gas from the axis-side nozzle 35, the thick colored area is caused at the central (axis) side, and the flow speed and the flow rate of the central (axis) area increase more than those of FIG. 15A.

FIGS. 15A through 15C show that the adjustment of increasing the flow rate on the peripheral side and the axis side is possible by providing the outer nozzle 34 and the axis-side nozzle 35 in addition to the base nozzle 33.

Figure 16A:
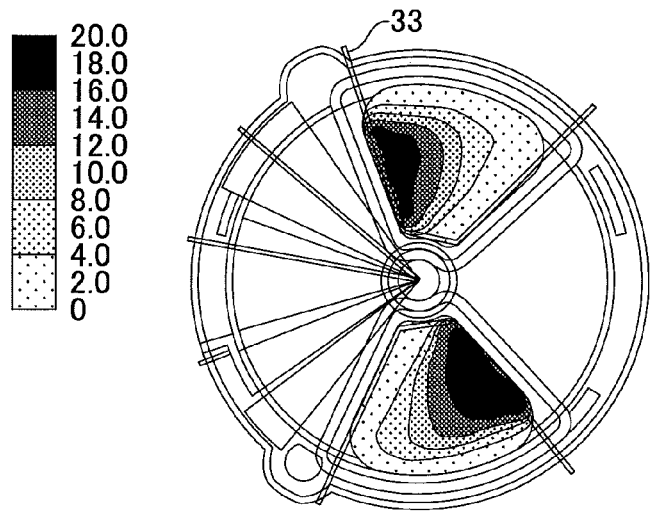
FIGS. 16A through 16C are fourth through sixth diagrams showing simulation results of gas flow rate adjustment by a plurality of plasma processing gas nozzles provided in the plasma process area.
Figure 16B:
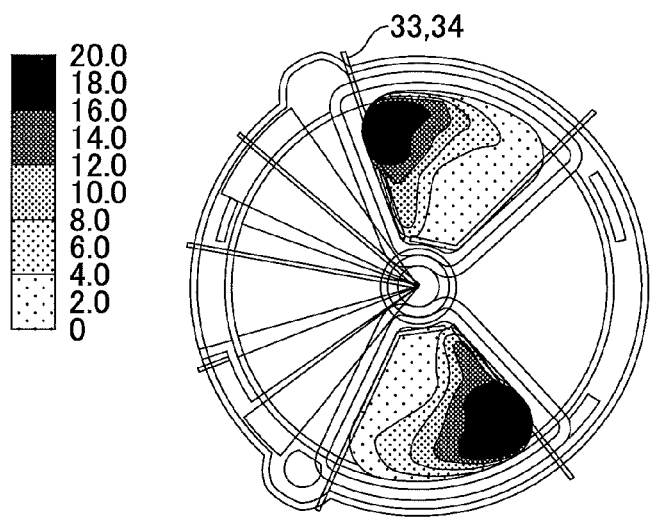
Figure 16C:
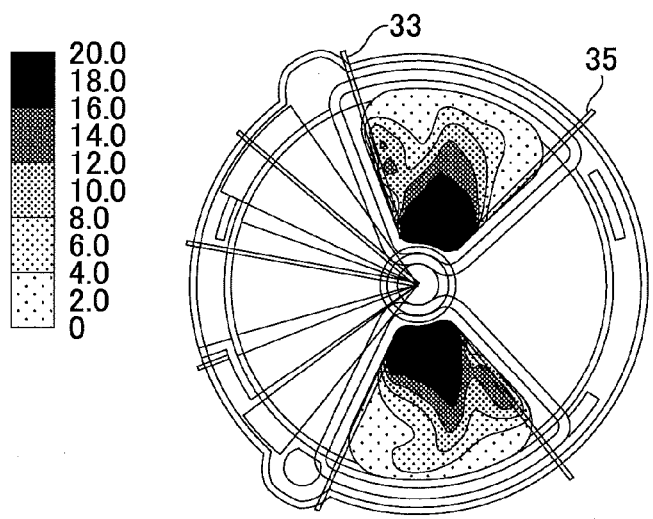

FIGS. 16A through 16C are fourth through sixth diagrams showing simulation results of the gas flow rate adjustment by the plurality of plasma processing gas nozzles 33 through 35 provided in the plasma process area P2.

FIG. 16A is a diagram showing a simulation result of a flow speed distribution of the plasma processing gas when supplying 100% of the plasma processing gas from the base nozzle 33. As shown in FIG. 16A, the flow speed is similar throughout the radius of the turntable 2.

FIG. 16B is a diagram showing a simulation result of a flow speed distribution of the plasma processing gas when supplying 60% of the plasma processing gas from the base nozzle 33 and 40% of the plasma processing gas from the outer nozzle 34. As shown in FIG. 16B, by supplying the plasma processing gas from the outer nozzle 34, the flow speed in the peripheral area increases relative to the other area.

FIG. 16C is a diagram showing a simulation result of a flow speed distribution of the plasma processing gas when supplying 60% of the plasma processing gas from the base nozzle 33 and 40% of the plasma processing gas from the axis-side nozzle 35. As shown in FIG. 16C, by supplying the plasma processing gas from the axis-side nozzle 35, the flow speed in the central (axis) area increases relative to the other area.

FIGS. 16A through 16C indicate that the adjustment of increasing the flow speed on the peripheral side and the axis side is possible by providing the outer nozzle 34 and the axis-side nozzle 35 in addition to the base nozzle 33.

Thus, by providing the outer nozzle 34 and the axis-side nozzle 35 in addition to the base nozzle 33, the flow speed on the peripheral side and the axis side can be increased relative to the other area. Hence, the distribution of the amount of plasma processing within the surface of the wafer W can be adjusted not only by adjusting the distance between the turntable 2 and the ceiling surface 46 of the plasma process area P2 but also by using the plurality of plasma processing gas nozzles 33 through 35. Although FIGS. 12 through 14D show the simulation results of the insufficient uniformity of the plasma process across the surface of the wafer W when the distance between the turntable 2 and the ceiling surface 46 of the plasma process area P2 is 90 mm or 105 mm, even when the distance between the turntable 2 and the ceiling surface 46 of the plasma process area P2 is 90 mm or 105 mm, sufficient uniformity of the plasma process across the surface of the wafer W can be obtained by increasing the flow rate of the plasma processing gas from the outer gas nozzle 35 and the flow speed of the plasma processing gas on the peripheral side relative to the other area. Accordingly, for example, it is possible to set the distance between the turntable 2 and the ceiling surface 46 of the plasma process area P2 at 90 mm in the design phase and to perform the adjustment depending on the actual process by using the plurality of plasma process gas nozzles 33 through 35.

Thus, the plasma processing apparatus according to the embodiment only has to set the distance between the turntable 2 and the ceiling surface 46 of the plasma process area P2 at 90 mm or longer.

The adjustment of the flow speed of the plasma processing gas can be naturally performed by moving the plasma generator 81 up and down or moving the turntable 2 up and down, and any mechanism can be selectively adopted depending on the intended use and the like. When the drive mechanism for moving the plasma generator 81 up and down is provided, as discussed above, the ring-shaped member 82 including the bellows 82a extendable and contractable in the vertical direction is provided between the opening 11a of the top plate 11 and the flange part 90a of the housing 90. Accordingly, the distance between the plasma generator 81 and the turntable 2 can be adjusted to a desired distance while controlling the inside of the plasma process area P2 in an airtight manner. In other words, the intrusion of an external gas into the plasma process area P2 to be caused by the change of the distance between the plasma generator 81 and the turntable 2 can be prevent by the ring-shaped member 82 and the housing 90.

The distance between the plasma generator 81 and the turntable 2 is not limited to a specific value, but can be set in, for example, a range from 20 to 120 mm. However, in a thinning process, the distance between the plasma generator 81 and the turntable 2 is preferred to be made longer. When the distance between the plasma generator 81 and the turntable 2 is made long, because most of ion components among active species supplied to the wafer W disappear before reaching the wafer W, the wafer W is processed by radical components primarily. Because a film including carbon is likely to be etched by the radical components, a sufficient etching rate can be ensured even when the output of the high frequency power source is made a low output easy to control. In other words, by lengthening the distance between the plasma generator 81 and the turntable 2, the controllability of plasma etching such as the uniformity of etching, ensuring isotropic etching and the control of an amount of etching can be enhanced.

The distance between the plasma generator 81 and the turntable 2 is preferred to be adjusted based on the distribution of the plasma process within the surface of the wafer W after receiving the actual plasma process, but when the data of those are preliminarily established, changing the distance in a recipe is possible.

Although a type of the plasma processing gas is not limited to a specific type, for example, a mixed gas of a noble gas such as Ar gas and an oxygen-containing gas or a hydrogen-containing gas such as $O_2$ gas, $O_3$ gas, $H_2O$ gas, $H_2$ gas or $NH_3$ gas, and the like can be used. At this time, although the flow rate of the plasma processing gas is not limited to a specific flow rate, for example, the flow rate of the noble gas can be set in a range from about 1000 sccm to about 20000 sccm (e.g., 15000 sccm as an example), and the flow rate of the oxygen-containing gas can be set in a range from about 100 sccm to about 2000 sccm (e.g., 500 sccm as an example). Although the pressure inside the vacuum chamber 1 is not limited to a specific value, for example, the pressure inside the vacuum chamber 1 can be set in a range from about 0.5 Torr to about 4 Torr (e.g., 1.8 Torr as an example). Although the output of the high frequency power source is not limited to a specific value, for example, the output of the high frequency power source can be set in a range from about 500 W to about 5000 W (e.g., 1000 W to 1600 W as an example). Although the temperature of the wafer W is not limited to a specific value, for example, the temperature of the wafer W can be set in a range from about 40° C. to about 120° C. (e.g., 85° C. as an example). Although the rotational speed of the turntable 2 is not limited to a specific value, for example, the rotational speed of the turntable 2 can be set in a range from about 10 rpm to about 300 rpm (e.g., 180 rpm as an example).

After adjusting the flow speed of the plasma processing gas, by starting the thinning process again, the thinning process having the excellent uniformity across the surface of the wafer W can be performed.

[Second Process: Film Deposition Process and Modification Process]

The plasma processing method according to the embodiment can be applied when a film deposition process by ALD is to be performed on a wafer W having a carbon pattern on which a predetermined amount of etching is already performed.

With respect to film deposition characteristics by ALD, desired characteristics can be obtained by changing the distance between the plasma generator 81 and the turntable 2, the type of the plasma processing gas, the flow rate of the plasma processing gas, the pressure inside the vacuum chamber 1, the temperature of the wafer W, the rotational speed of the turntable 2 and the like. A description is given below of an example of a film deposition method by ALD using the plasma processing method of the embodiment.

To begin with, the wafer W is heated to a predetermined temperature.

Next, a first process gas such as an S— containing gas or a metal-containing gas described later is discharged from the first process gas nozzle 31 at a predetermined flow rate while a plasma processing gas containing an oxidation gas or a nitriding gas described later is supplied from the plasma processing gas nozzles 33 through 35 at a predetermined flow rate.

The inside of the vacuum chamber 1 is adjusted to a predetermined pressure by the pressure controller 65. In the plasma generator 81, high frequency power of a predetermined output is supplied to the antenna 83.

The Si-containing gas or the metal-containing gas adsorbs on a surface of a wafer W in the first process area P1. Next, the wafer W moves to the second process area P2 by the rotation of the turntable 2, and the Si-containing gas or the metal-containing gas adsorbed on the surface of the wafer W is oxidized or nitrided by the plasma processing gas in the second process area P2. This causes at least one molecular layer of an oxide film or a nitride film that is a component of a thin film to be deposited on the surface of the wafer W, thereby forming a reaction product.

Although the distance between the plasma generator 81 and the turntable 2 is not limited to a specific value, for example, the distance can be set in a range from 20 to 120 mm. However, in an early stage of the film deposition process, the distance between the plasma generator 81 and the turntable 2 is preferred to be made longer, for example, 120 mm. At this time, the output of the high frequency power source is preferred to be set at a relatively low output, for example, 1000 W. Because the active species influences greatly on the wafer W in the early stage of the film deposition, the distance between the plasma generator 81 and the turntable 2 is preferred to be made longer. Here, the "early stage of the film deposition process" can be defined as a stage, for example, until the film to be deposited becomes a film thickness of about 2 mm, though depending on the electric wiring structure or the types of film deposition gases.

In contrast, after the film having a certain amount of thickness, for example, the thickness of about 2 nm is deposited, the distance between the plasma generator 81 and the turntable 2 is preferred to be shortened, for example, to about 30 mm. At this time, the output of the high frequency power source is preferred to be set at a relatively high output, for example, about 3000 W.

The reason is given below why shortening the distance between the plasma generator 81 and the turntable 2 is preferable after the film having the certain amount of thickness is deposited on the wafer W. In general, a thin film deposited by ALD sometimes contains impurities such as chlorine, an organic substance and the like, for example, caused by a remaining group contained in the first process gas. However, in the film deposition method in the embodiment, the distance between the plasma generator 81 and the turntable is shortened after depositing a film having a predetermined thickness. This allows the film obtained by an ion effect within the plasma to be modified. More specifically, for example, an ion collision with the surface of the wafer W caused by the plasma causes the impurities to be released from the thin film by becoming HCl or an organic gas. Moreover, elements within the thin film are rearranged, thereby densifying the thin film.

In the embodiment, by continuing to rotate the turntable 2, the adsorption of the process gas on the surface of the wafer W, oxidation or nitriding of components adsorbed on the wafer surface, and plasma modification of the reaction product are performed in this order many times. In other words, the film deposition process by ALD and the modification process of the deposited film are performed many times by the rotation of the turntable 2.

In the plasma processing apparatus of the embodiment, the separation areas D are provided between the first and second process areas P1 and P2. In other words, the separation areas D and the first and second process areas P1 and P2 are arranged alternately along the circumference direction of the turntable 2. With this configuration, the process gas and the plasma processing gas are prevented from mixing with each other by the separation areas D, and are exhausted from the first and second exhaust openings 61 and 62.

Examples of the first process gas of the present embodiment include a silicon-containing gas such as DIPAS [diisopropylaminosilane], 3DMAS [trisdimethylaminosilane] gas, BTBAS [bistertialbutylaminosilane], DCS [dichlorosilane], and HCD [hexachlorodisilane]; and a metal-containing gas such as $TiCl_4$ [titanium tetrachloride], Ti(MPD)(THD) [titanium methylpentanedionatobistetramethylheptanedionato], TMA [trimethylaluminum], TEMAZ [tetrakisethylmethylaminozirconium], TEMHF [tetrakisethylmethylaminohafnium], and Sr(THD)2 [strontium bistetramethylheptanedionato].

Various gases may be selected as the plasma processing gas depending on the usage of plasma. For example, a mixed gas of an Ar gas mainly used for generating plasma, and one or both of an oxygen-containing gas (e.g., $O_2$ gas, $O_3$ gas, or $H_2$ gas) and a hydrogen-containing gas (e.g., $H_2$ gas or $NH_3$ gas) suitable for a process to be performed on a formed film (e.g., plasma etching (thinning) or film modification by plasma) may be used as the plasma processing gas.

As the separation gas, for example, $N_2$ gas may be used.

Although the flow rate of the first process gas during the film deposition process is not limited to a specific value, the flow rate of the first process gas during the film deposition process can be set in, for example, a range from 50 sccm and 1000 sccm.

Although the flow rate of the oxygen-containing gas included in the plasma processing gas is not limited to a specific value, the flow rate of the oxygen-containing gas included in the plasma processing gas can be, for example, the flow rate can be set in a range from about 500 sccm to about 5000 sccm (e.g., 500 sccm as an example).

Although the pressure in the vacuum chamber 1 is not limited to a specific value, the pressure can be, for example, set at about 0.5 Torr and about 4 Torr (e.g., 1.8 Torr as an example).

Although the temperature of the wafer W is not limited to a specific value, the temperature can be set, for example, in a range from about 40° C., to about 200° C.

Although the rotational speed of the turntable 2 is not limited to a specific value, the temperature can be set in, for example, from about 60 rpm to about 300 rpm.

By performing such a process, a distribution of a density of the film of the wafer W can be obtained after depositing a film. For example, the distribution of the density of the film on the wafer W can be obtained by performing a wet etching and by measuring the distribution of an amount of etching. In other words, the etching rate becomes small when the film density is high, and the etching rate becomes high when the film density is low. By performing the plasma process for modification, the film is densified and the density becomes high. Thus, by obtaining the distribution of the film density, the amount of plasma processing within the surface of the wafer can be obtained.

After obtaining the amount of plasma processing within the surface of the wafer W, the adjustment of the flow speed of the plasma processing gas is performed so as to obtain a desired amount of plasma processing in a way similar to the above description. After the adjustment, by performing the film deposition process and the film quality modification process, the uniformity of the plasma process on the film across the surface of the wafer W can be improved.

As described above, according to the embodiments of the present invention, the amount of plasma processing within the surface of the wafer W can be properly adjusted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A plasma processing method for performing a plasma process on a film deposited on a substrate by supplying a plasma processing gas into a predetermined plasma process area and converting the supplied plasma processing gas to plasma in a plasma generation area formed in the predetermined plasma process area, the method comprising steps of:

placing a substrate on a turntable provided in a process chamber, the predetermined plasma process area being provided in a predetermined area along a rotational direction of the turntable and having a ceiling surface and a side wall to define the predetermined plasma area above the turntable, the plasma generation area being located in the vicinity of the ceiling surface within the predetermined plasma process area;

obtaining a distribution of an amount of processing within a surface of the substrate by a plasma process performed on a film deposited on the substrate, the plasma process being performed on the film deposited on the substrate every time the substrate passes through the predetermined plasma process area by continuously rotating the turntable for a predetermined period of time;

adjusting a flow speed of the plasma processing gas so as to cause the flow speed of the plasma processing gas in the plasma generation area to become substantially uniform by increasing the flow speed of the plasma processing gas supplied to a first area where the amount of processing is expected to be increased so as to make the flow speed in the first area higher than the flow speed in another area or by decreasing the flow speed of the plasma processing gas supplied to a second area where the amount of processing is expected to be decreased so as to make the flow speed in the second area lower than the flow speed in another area; and performing the plasma process on the film deposited on the substrate by supplying the plasma processing gas having the adjusted flow speed into the predetermined plasma process area, the plasma processing gas being supplied from a plurality of locations provided in the predetermined plasma process area, the plasma processing gas being supplied upward from at least one of the plurality of locations.

2. The method as claimed in claim 1, wherein the plasma processing gas is supplied from a plurality of gas nozzles provided to supply the plasma processing gas to different areas of the substrate, and wherein the step of adjusting the flow speed of the plasma processing gas is performed by adjusting each flow speed of each plasma processing gas supplied from each of the plurality of gas nozzles, separately.

3. The method as claimed in claim 2, wherein the plurality of gas nozzles includes a first gas nozzle for supplying the plasma processing gas to a whole area of the substrate, a second gas nozzle for supplying the plasma processing gas to a central area near a center of the turntable with respect to the substrate, and a third gas nozzle for supplying the plasma processing gas to a peripheral area near a periphery of the turntable with respect to the substrate, and wherein the step of adjusting the flow speed of the plasma processing gas comprises a step of supplying the plasma processing gas from at least one of the first, second and third gas nozzles.

4. The method as claimed in claim 2, wherein the flow speed of the plasma processing gas is adjusted by a flow rate of the plasma processing gas.

5. The method as claimed in claim 2, wherein the step of adjusting the flow speed of the plasma processing gas is performed by changing a distance between the turntable and the ceiling surface.

6. The method as claimed in claim 5, wherein the distance between the turntable and the ceiling surface is changed by moving at least one of the turntable and the ceiling surface up and down.

7. The method as claimed in claim 5, wherein an exhaust opening is provided in the process chamber located below the turntable, and wherein the ceiling surface is adjusted to have a height to cause the plasma processing gas flowing along the ceiling surface to flow at a substantially uniform flow speed by resisting a suction force from the exhaust opening.

8. The method as claimed in claim 1, further comprising a step of:

performing a substrate process on the substrate other than the plasma process in an area on and above the turntable in the process chamber other than the predetermined plasma process area when the substrate is outside the predetermined plasma process area by rotating the turntable.

9. The method as claimed in claim 8, wherein the substrate process comprises a film deposition process for depositing the film on the substrate.

10. The method as claimed in claim 1, wherein the amount of processing within the surface of the substrate by the plasma process performed on the film is obtained by a form of a film thickness distribution.

11. The method as claimed in claim 1, wherein the amount of processing within the surface of the substrate by the plasma process performed on the film is obtained by a form of a film density distribution.

* * * * *